United States Patent
Mullaney et al.

(10) Patent No.: US 9,340,336 B2
(45) Date of Patent: May 17, 2016

(54) EXTRUDED SEAL CARRIER AND METHOD OF USE

(71) Applicant: Tyco Electronics Corporation, Berwyn, PA (US)

(72) Inventors: Julian S. Mullaney, Raleigh, NC (US); Barry Wayne Allen, Siler City, NC (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 8 days.

(21) Appl. No.: 13/859,076

(22) Filed: Apr. 9, 2013

(65) Prior Publication Data

US 2013/0292383 A1 Nov. 7, 2013

Related U.S. Application Data

(60) Provisional application No. 61/622,321, filed on Apr. 10, 2012.

(51) Int. Cl.
*B65D 53/06* (2006.01)
*H04Q 1/02* (2006.01)
*H05K 5/06* (2006.01)

(52) U.S. Cl.
CPC ............... *B65D 53/06* (2013.01); *H04Q 1/025* (2013.01); *H05K 5/062* (2013.01); *Y10S 285/91* (2013.01)

(58) Field of Classification Search
CPC ......... B65D 53/06; H04Q 1/025; H04Q 1/02; H05K 5/062; F16L 23/18; F16L 23/22; Y10S 285/91; Y10S 277/905
USPC .......... 220/378, 827–830, 849; 277/312, 316, 277/630, 637, 598, 922
See application file for complete search history.

(56) References Cited

U.S. PATENT DOCUMENTS 2,722,043 A * 11/1955 Nenzell ........................ 49/479.1
3,020,260 A    2/1962 Nelson
(Continued)

FOREIGN PATENT DOCUMENTS

JP     2011-190892    9/2011
WO    WO 96/23007    8/1996

OTHER PUBLICATIONS

International Search Report and Written Opinion for PCT/US2013/035811 mailed Jul. 15, 2013.
(Continued)

*Primary Examiner* — Fenn Mathew
*Assistant Examiner* — James N Smalley
(74) *Attorney, Agent, or Firm* — Merchant & Gould P.C.

(57) ABSTRACT

A sealing apparatus includes a carrier and sealant contained by the carrier. An enclosure interface includes first and second pieces and defines one or more sealing channels that the sealing apparatus may be positioned within. The first piece defines an opening that has a perimeter sealed by the sealing apparatus. When the first and second pieces are mounted together, the sealant forms a first interface seal with the first piece and a second interface seal with the second piece. The one or more sealing channels are interconnected by one or more junction sections that include a volume of sealant. The carrier may define first and second channels that respectively contain first and second volumes of sealant. The method for making the sealing apparatus may include extruding the first and second volumes of sealant into the first and second channels.

34 Claims, 27 Drawing Sheets

(56) References Cited

U.S. PATENT DOCUMENTS

| | | | |
|---|---|---|---|
| 3,555,663 A * | 1/1971 | Forman | B63B 3/13 220/2.3 R |
| 4,298,204 A * | 11/1981 | Jinkins | 277/641 |
| 4,369,284 A | 1/1983 | Chen | |
| 4,634,207 A | 1/1987 | Debbaut | |
| 4,680,233 A | 7/1987 | Camin et al. | |
| 4,716,183 A | 12/1987 | Gamarra et al. | |
| 4,777,063 A | 10/1988 | Dubrow et al. | |
| 4,830,182 A * | 5/1989 | Nakazato et al. | 206/454 |
| 4,852,646 A | 8/1989 | Dittmer et al. | |
| 4,942,270 A | 7/1990 | Gamarra | |
| 5,079,300 A | 1/1992 | Dubrow et al. | |
| 5,140,746 A | 8/1992 | Debbaut | |
| 5,177,143 A | 1/1993 | Chang et al. | |
| 5,357,057 A | 10/1994 | Debbaut | |
| 5,359,654 A | 10/1994 | Jensen et al. | |
| 5,507,062 A | 4/1996 | Salecker | |
| 6,494,464 B1 * | 12/2002 | Chandler et al. | 277/628 |
| 6,672,911 B2 | 1/2004 | Zhao et al. | |
| 7,603,018 B2 | 10/2009 | Mullaney et al. | |
| 2006/0204393 A1 | 9/2006 | Sobel et al. | |
| 2007/0200301 A1 | 8/2007 | Novil et al. | |
| 2011/0266752 A1 * | 11/2011 | Kocurek et al. | 277/322 |
| 2011/0272895 A1 * | 11/2011 | Kritzer et al. | 277/630 |

OTHER PUBLICATIONS

European Search Report for Application No. 13775916.3 mailed Nov. 23, 2015.

* cited by examiner

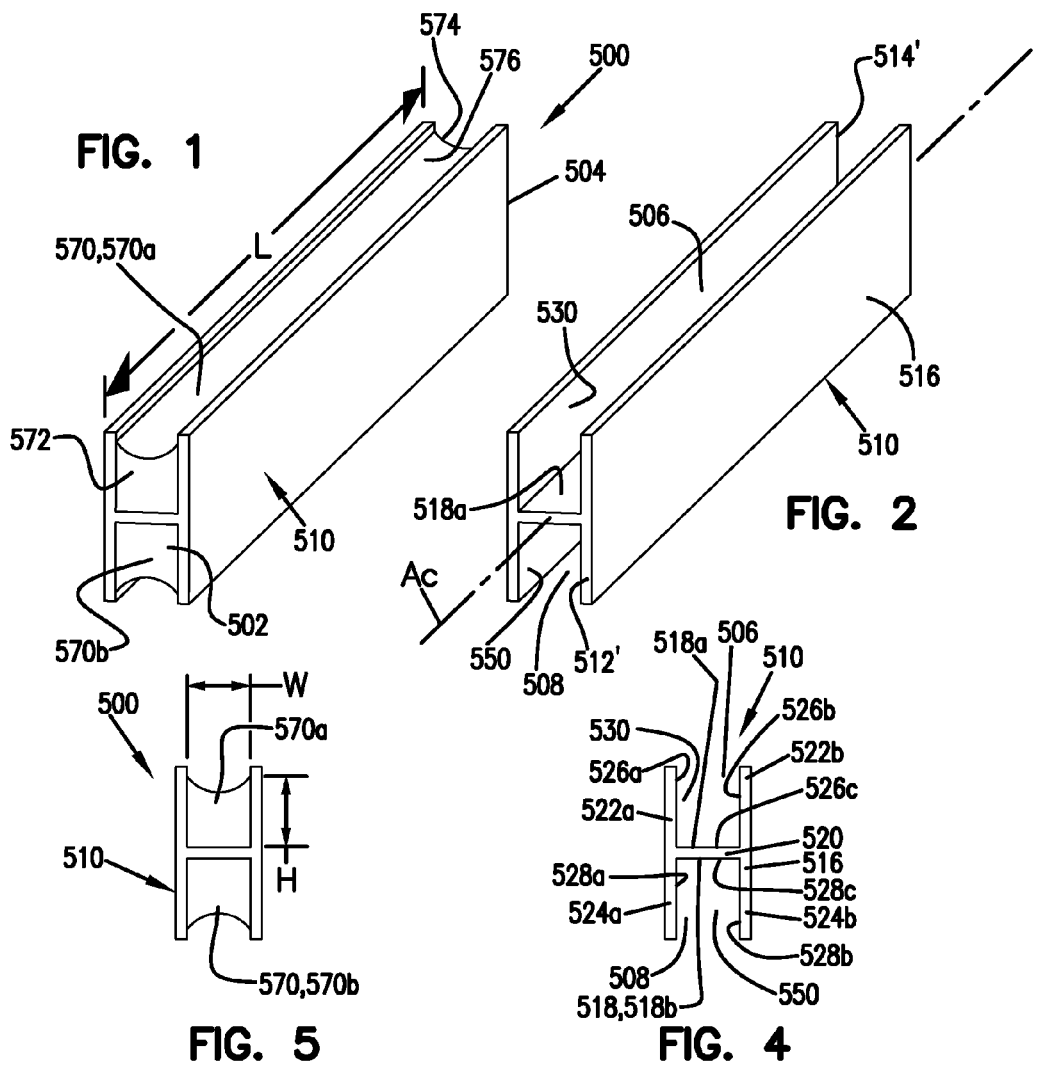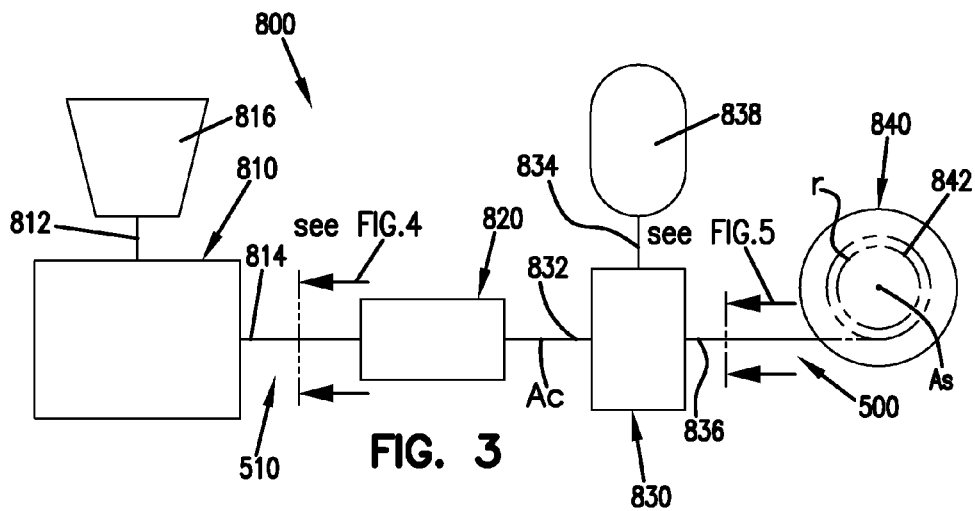

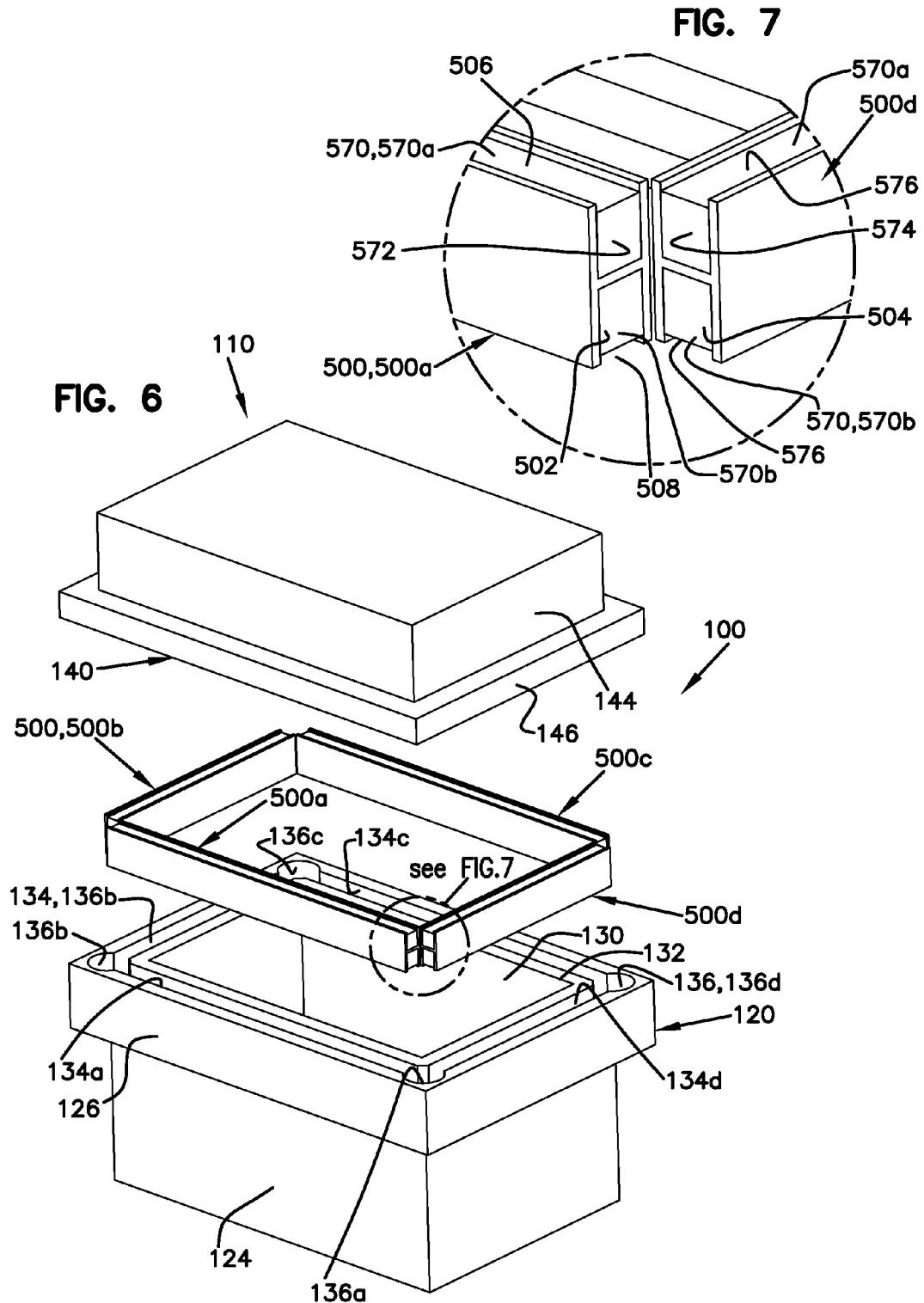

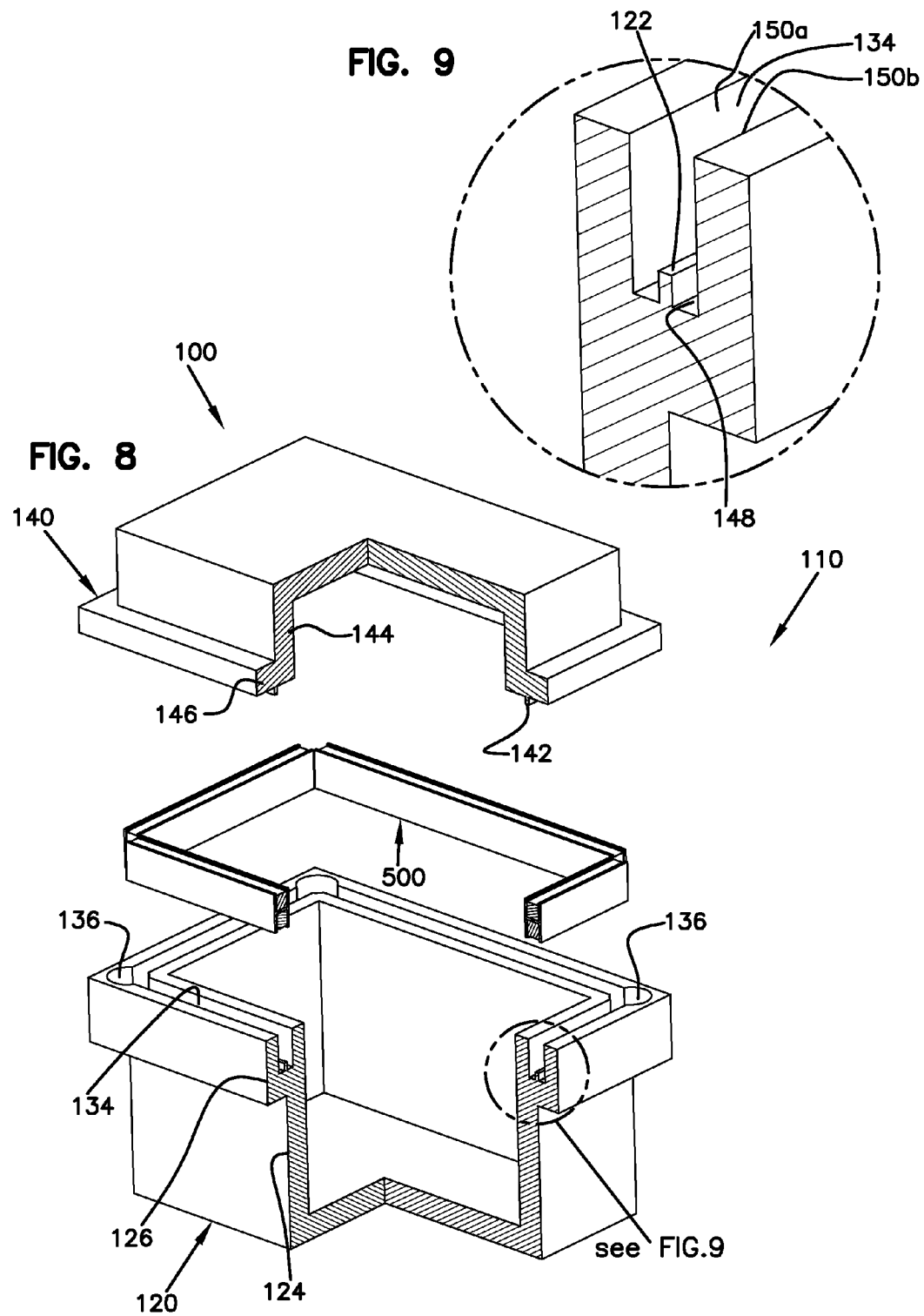

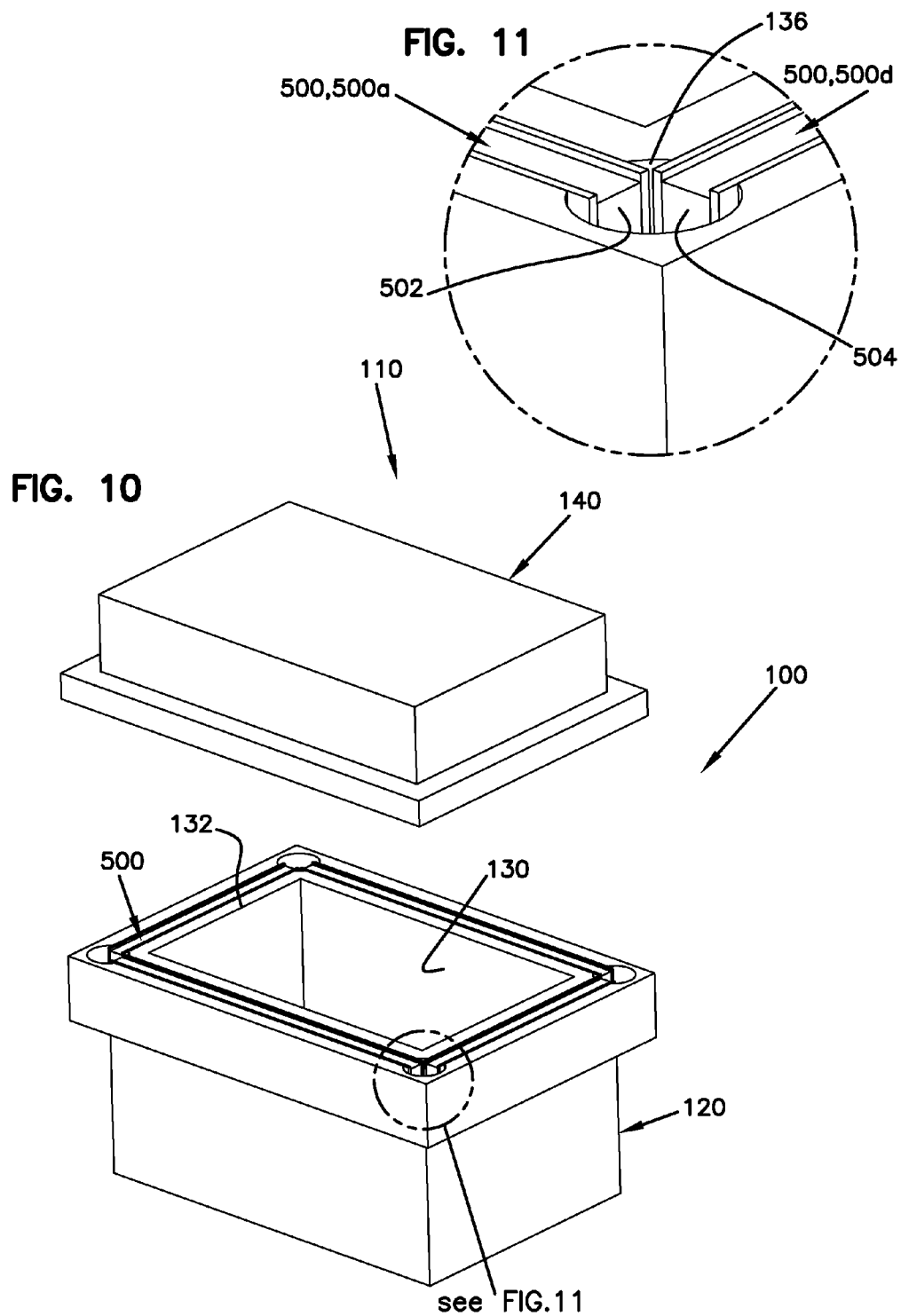

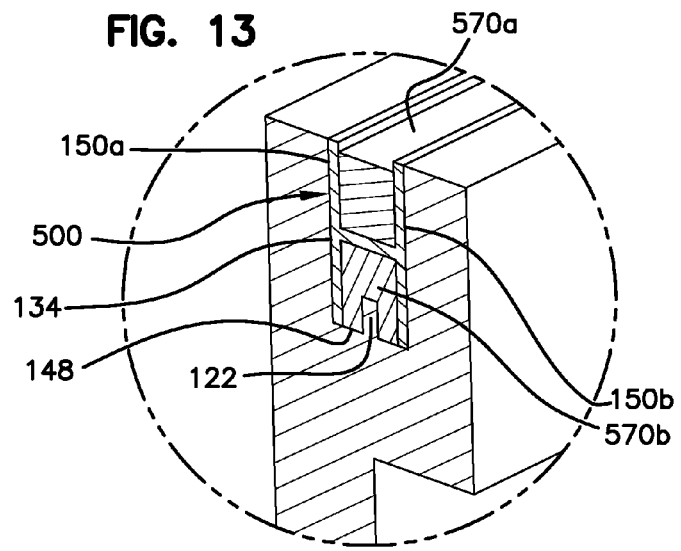
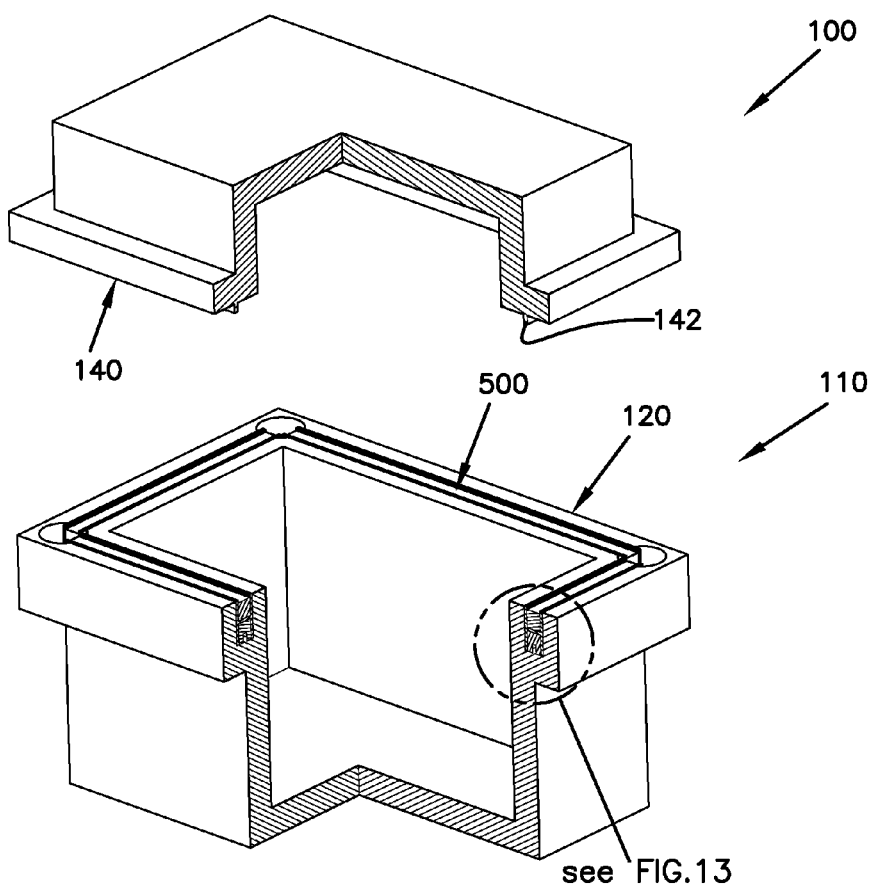

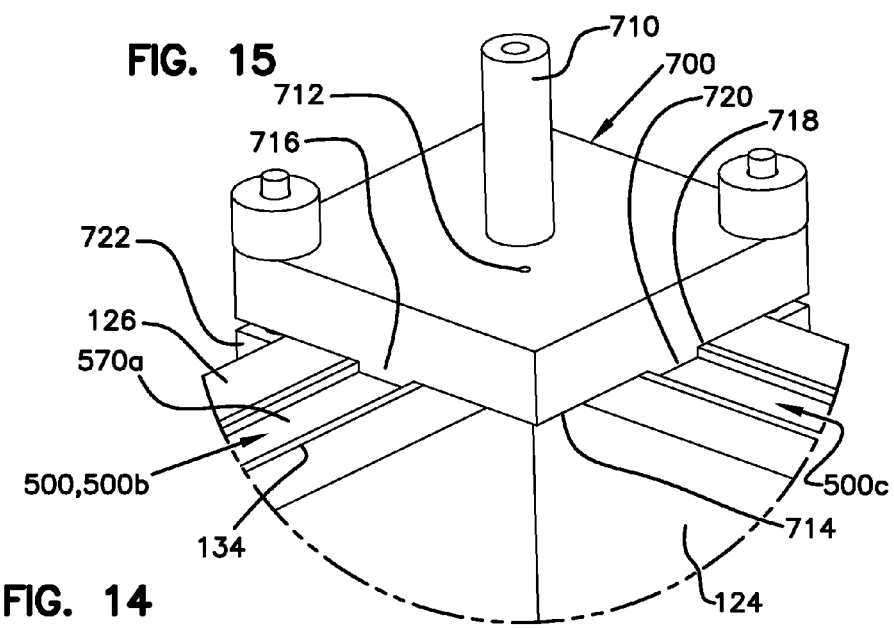
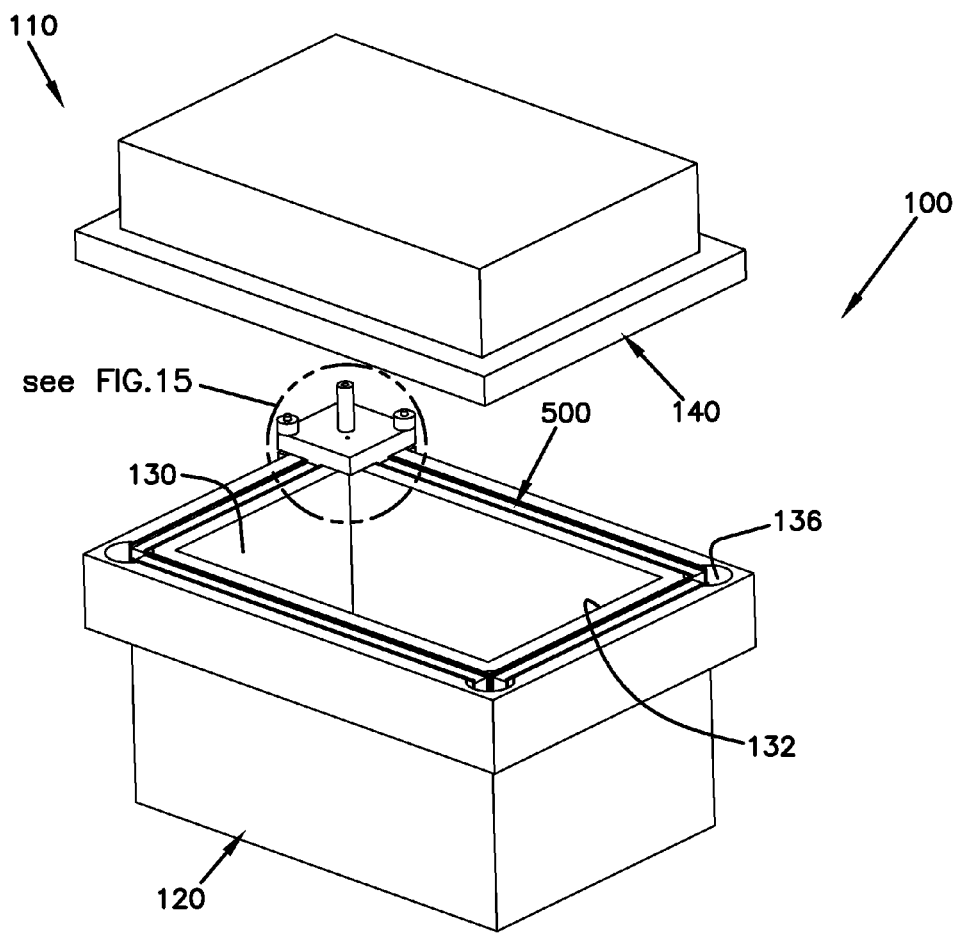

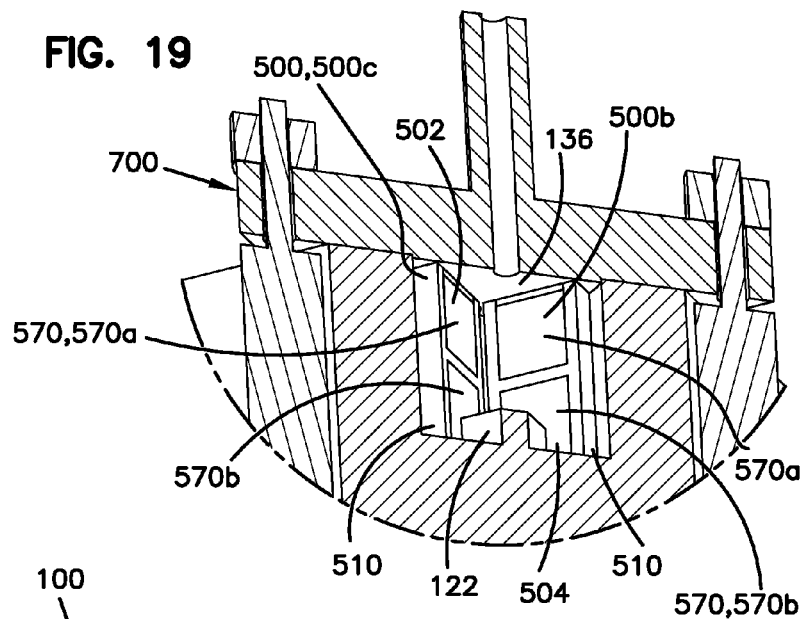
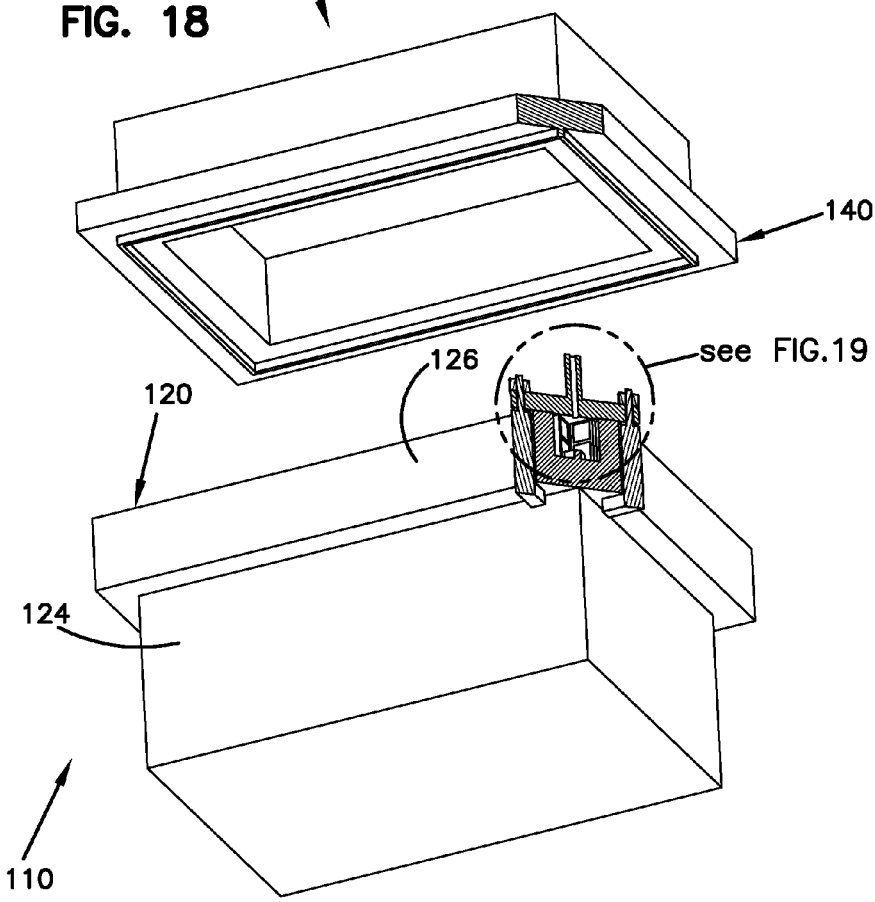

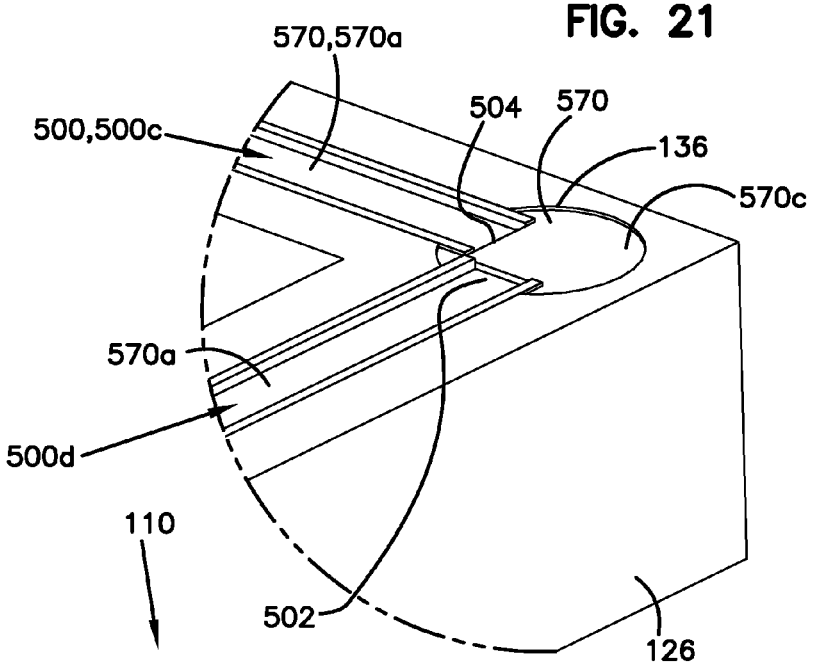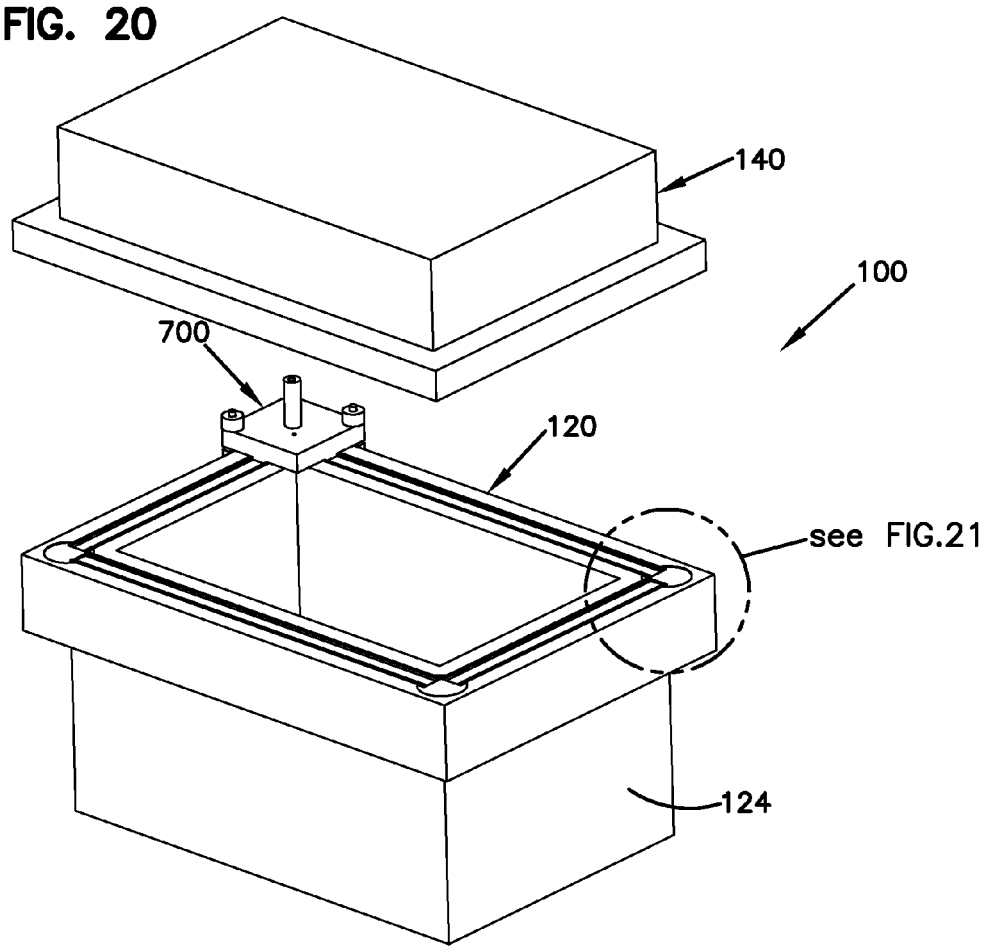

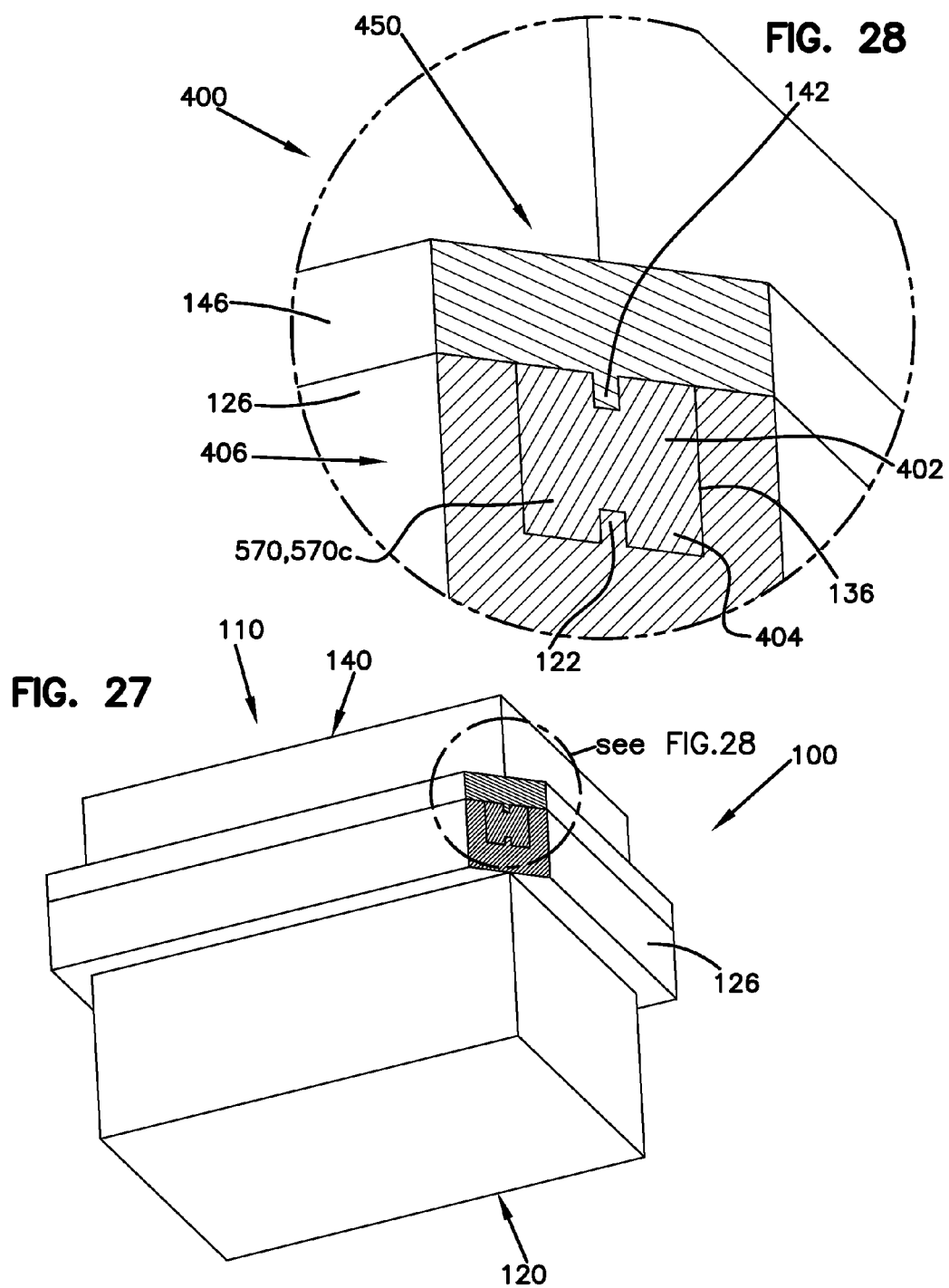

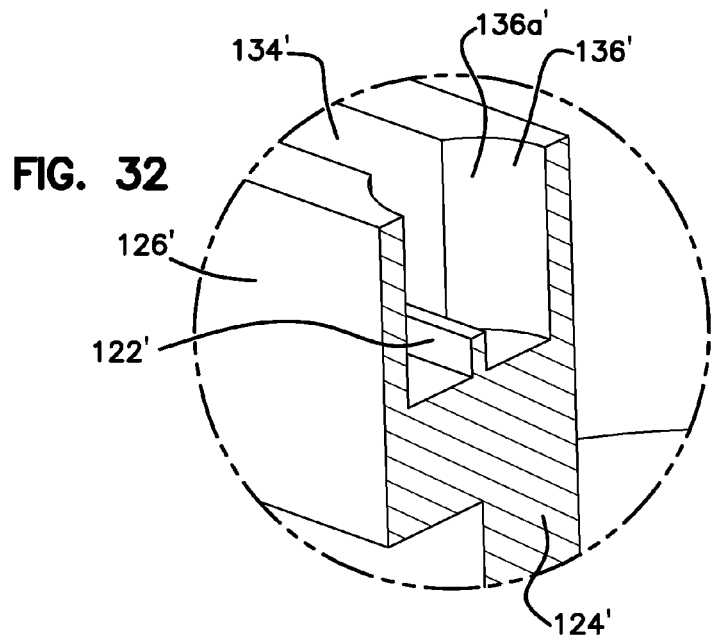
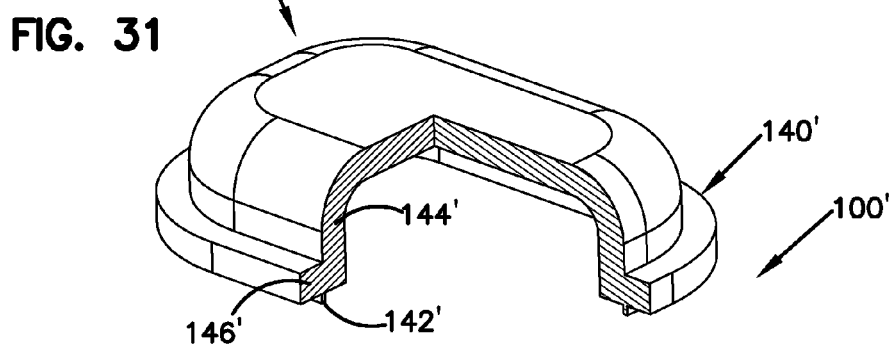
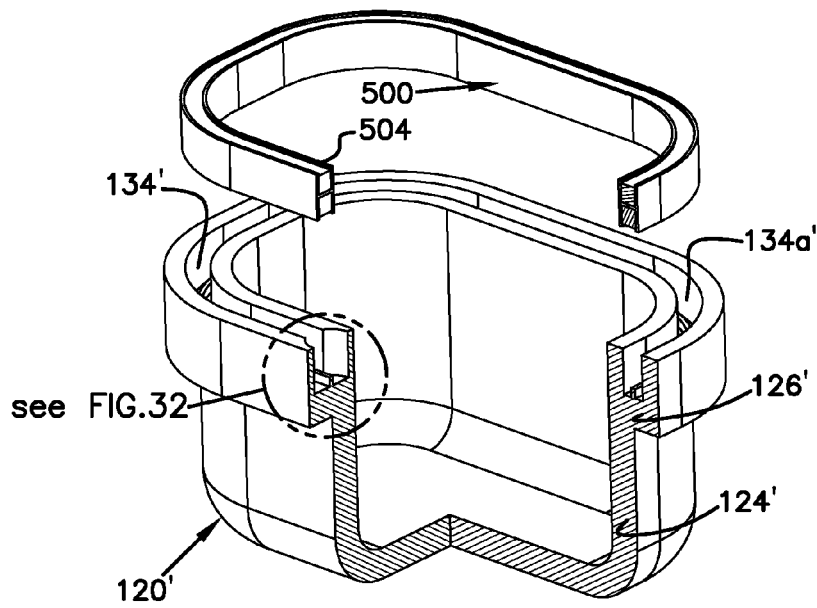

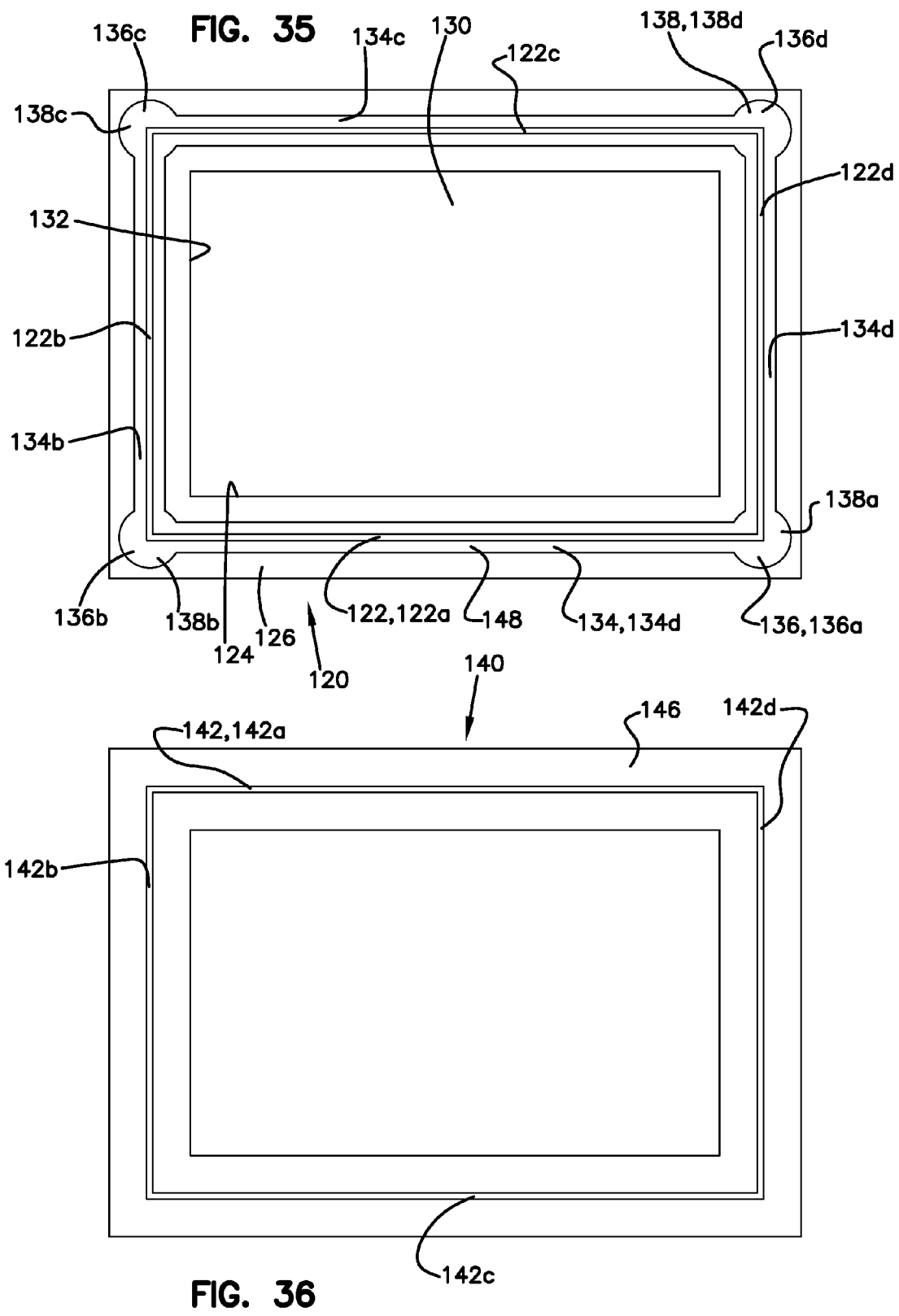

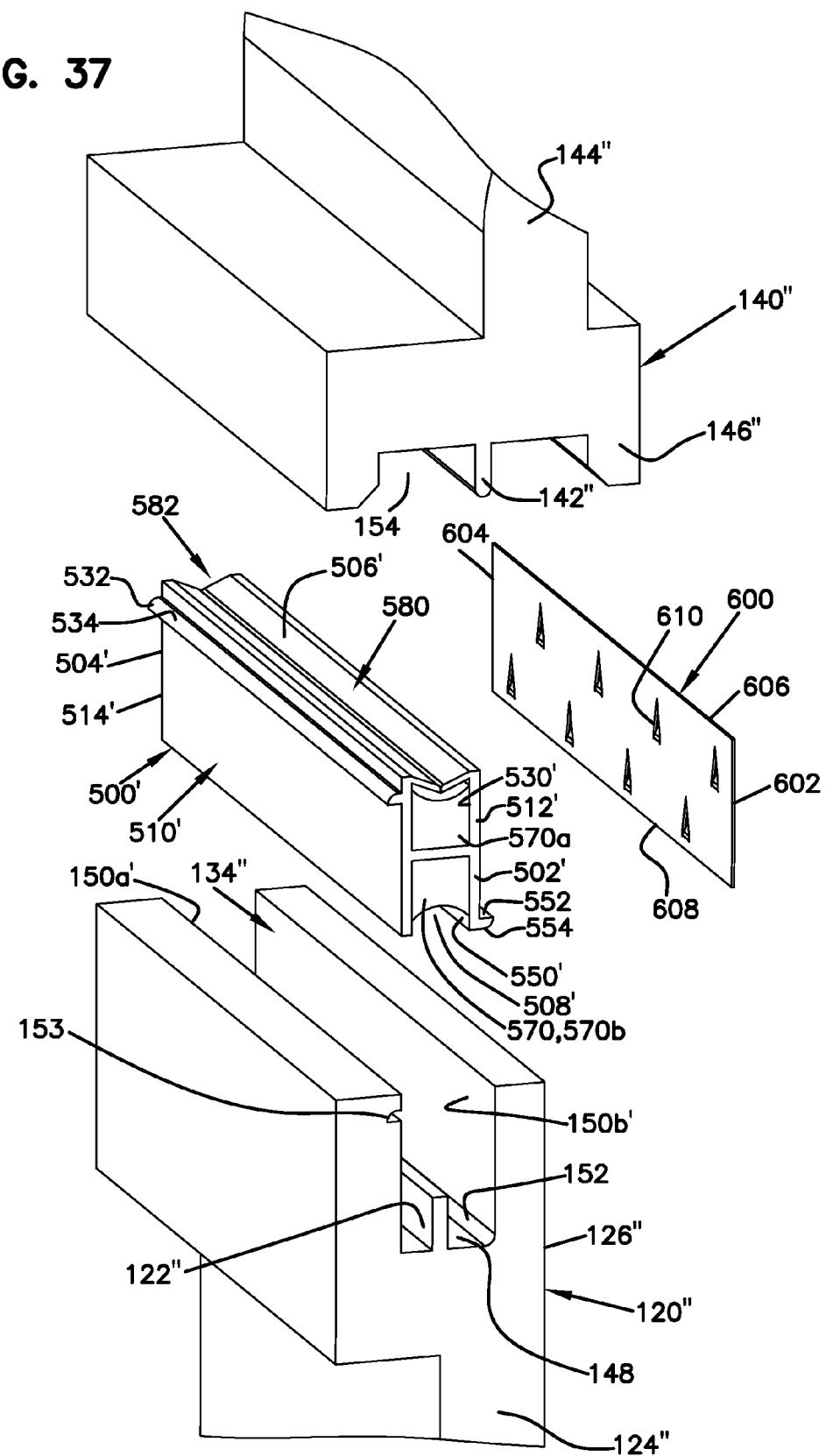

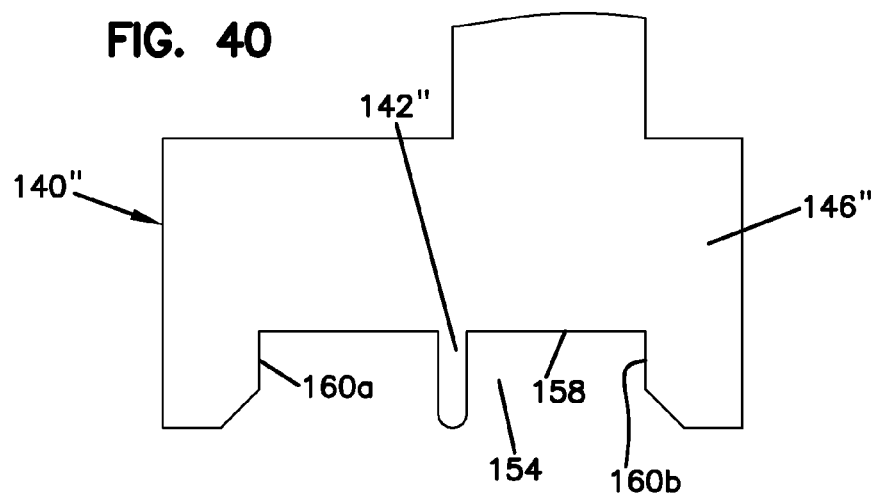
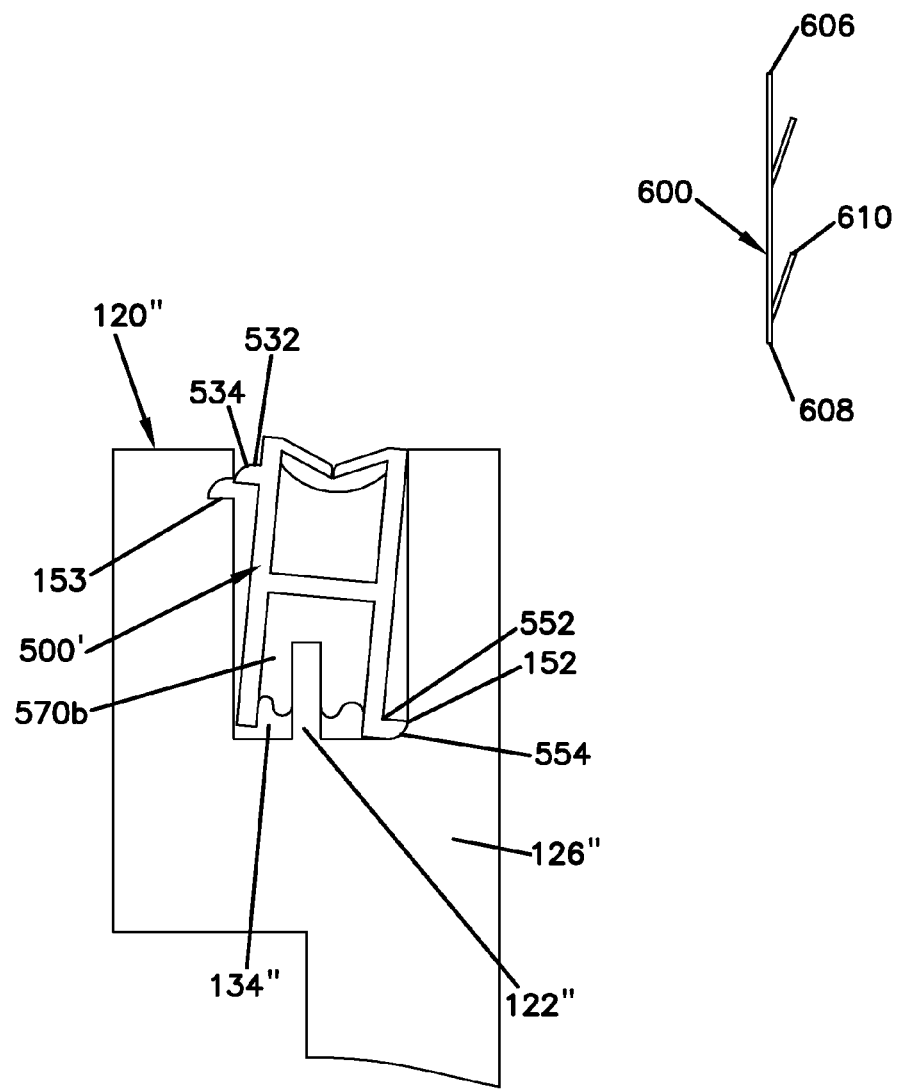

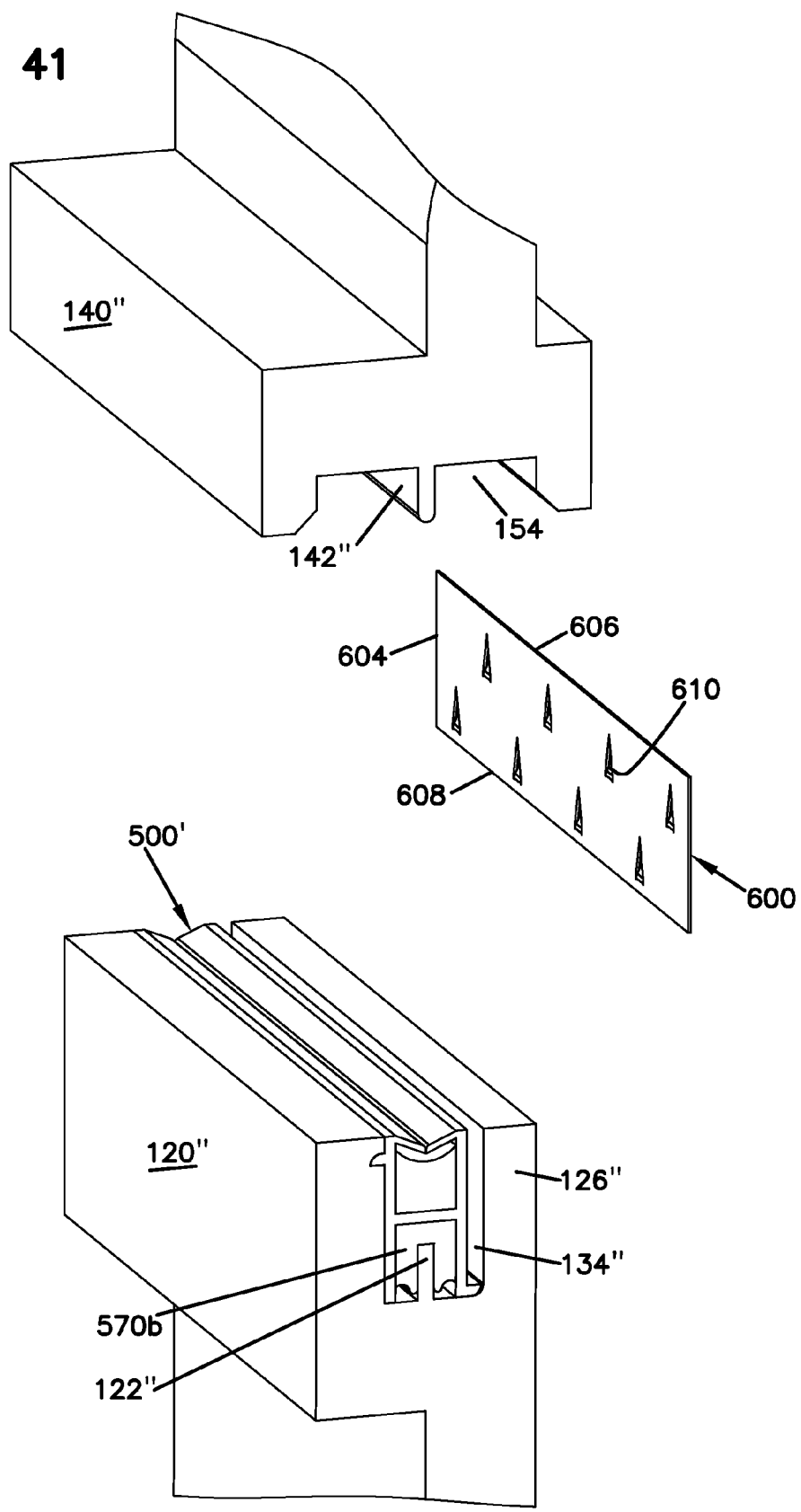

FIG. 42
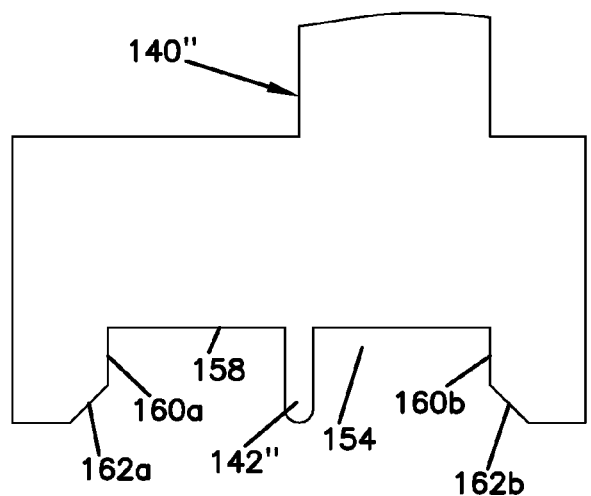
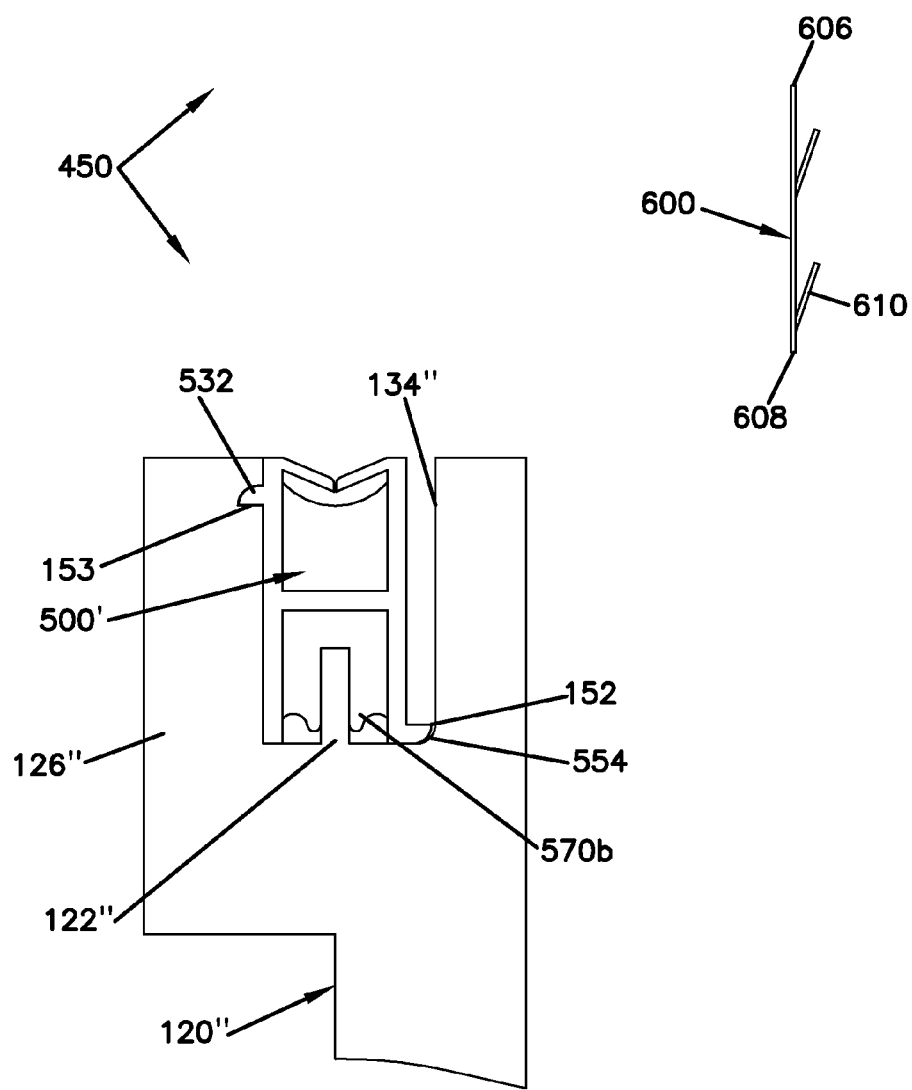

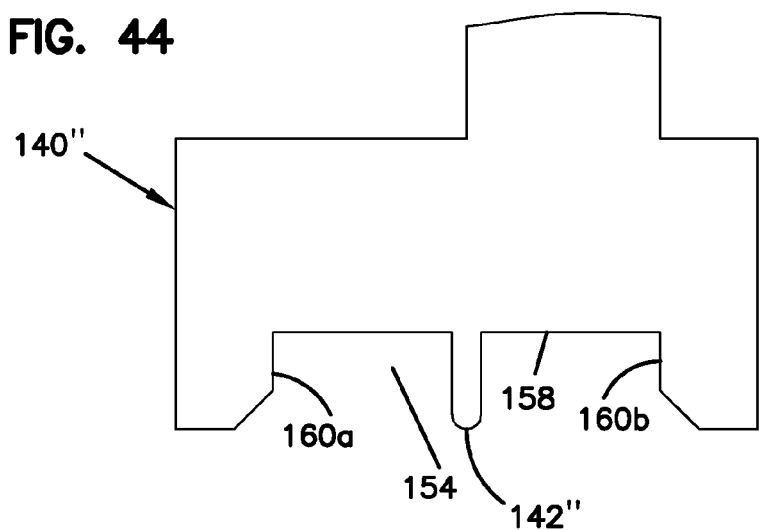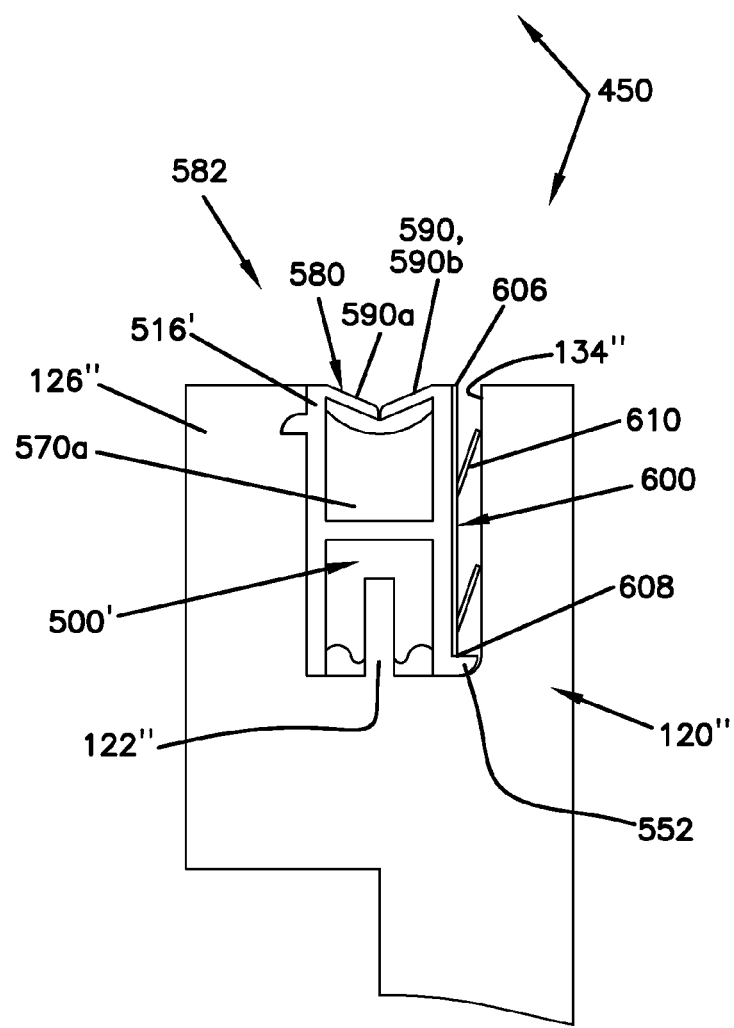

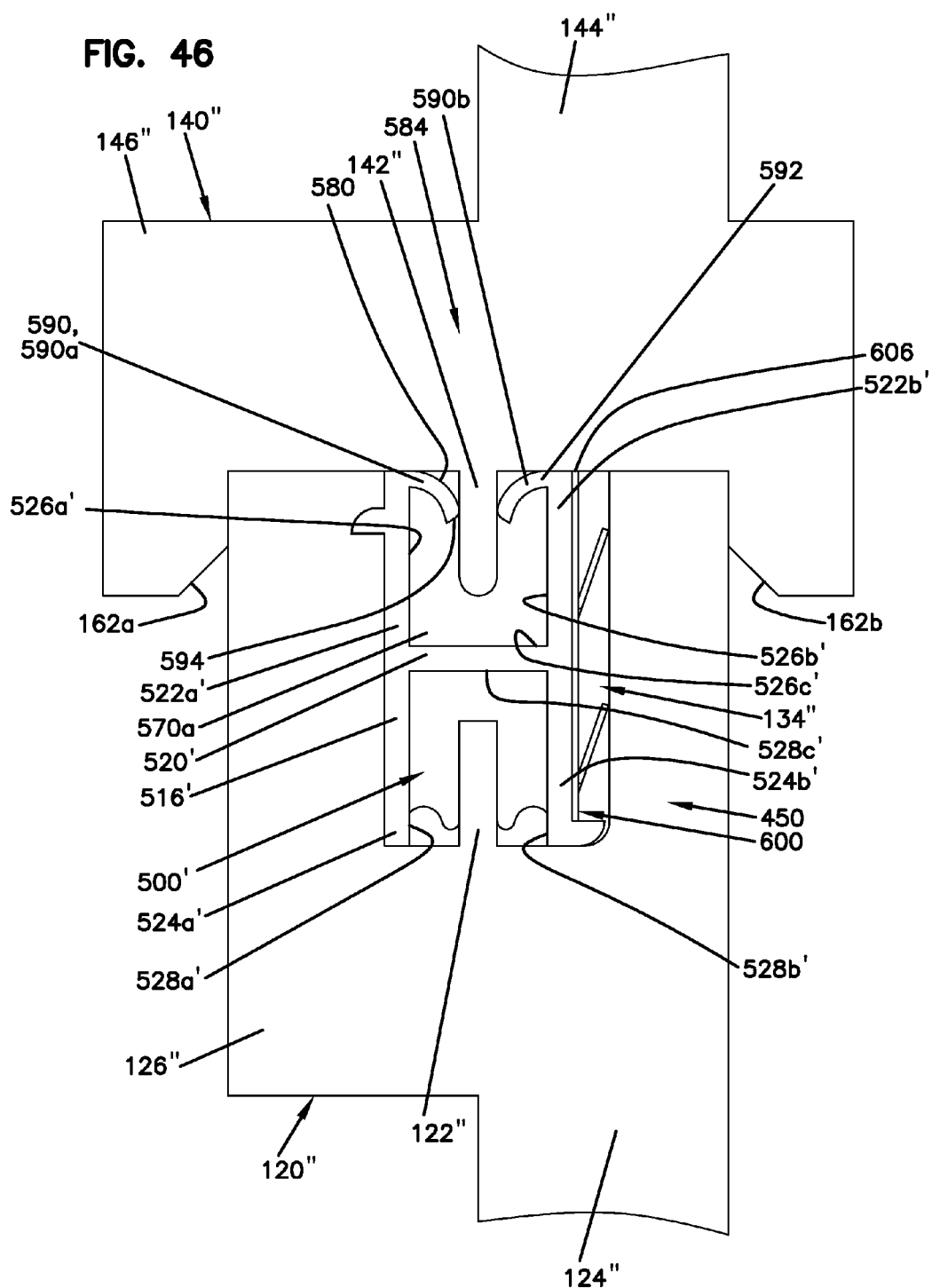

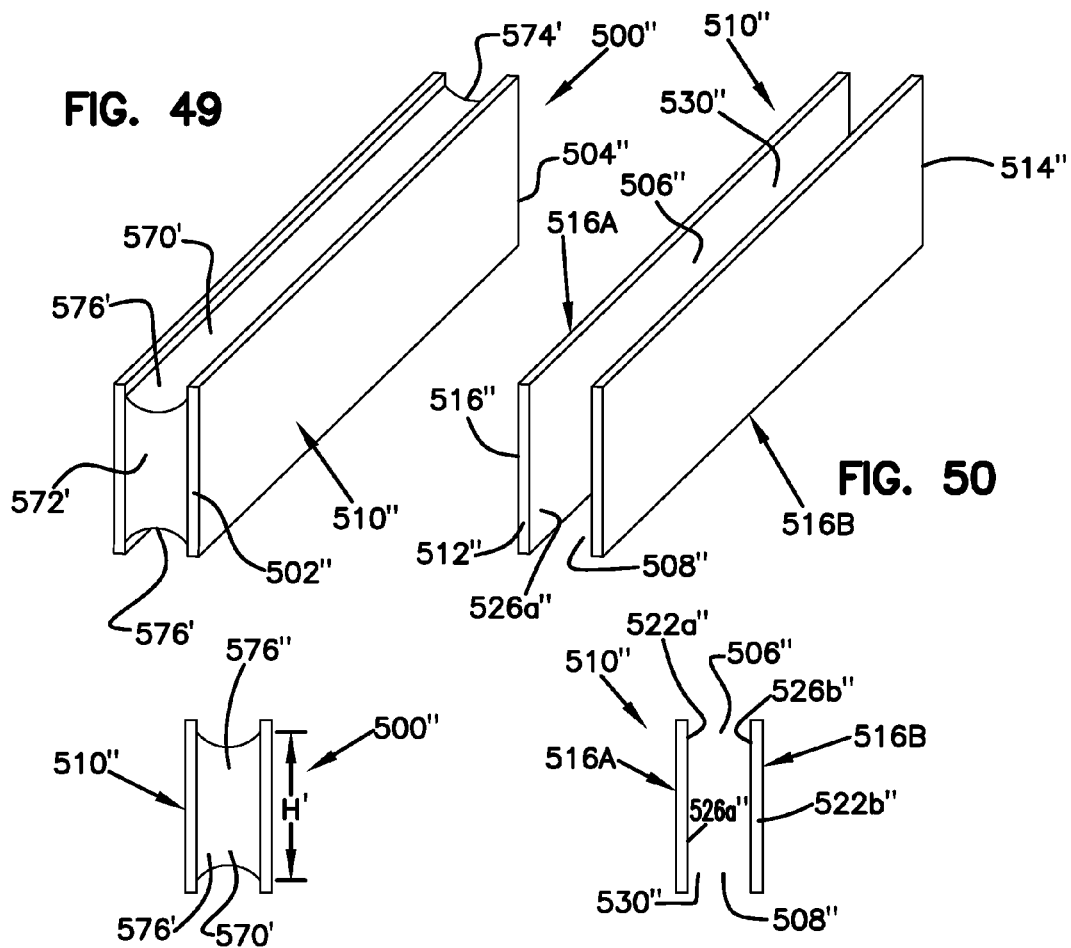
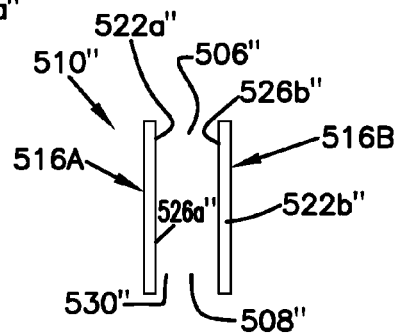
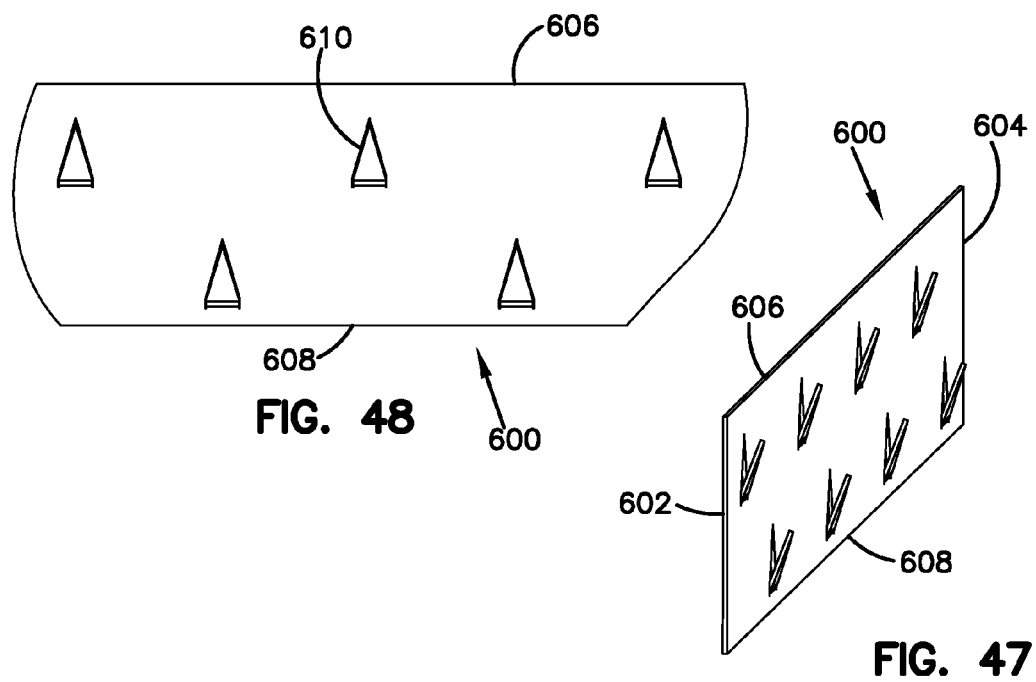

EXTRUDED SEAL CARRIER AND METHOD OF USE

CROSS-REFERENCE TO RELATED APPLICATION

The present application claims the benefit of U.S. Provisional Patent Application Ser. No. 61/622,321, filed Apr. 10, 2012, which application is hereby incorporated by reference in its entirety.

BACKGROUND

Telecommunications networks often use enclosures for containing and protecting telecommunications equipment (e.g., splice locations, splitters, multi-plexers, connection panels, etc.). Enclosures used in outside environments are desirably sealed to prevent moisture intrusion. Gel seals have worked extremely well for providing perimeter seals between bases and covers of enclosures and for providing seals at any other type of interface between housing pieces of an enclosure. An example gel sealed enclosure is disclosed at U.S. Pat. No. 7,603,018, which is hereby incorporated by reference in its entirety.

In such gel seals, gels are typically contained within a channel defined by either the base or the cover of the enclosure. The gels are installed in the channels by injection molding processes. Such processes involve mating the piece of the enclosure defining the channel to a matching injection mold piece such that the two pieces cooperate to define an injection cavity. The gel is then injected into the cavity and assumes the shape of the cavity. A problem with this type of process is that every time a new enclosure is designed or an existing enclosure is changed, a corresponding new injection mold also needs to be made. This increases cost and can lengthen the time required to introduce a new enclosure design. Also, due to issues relating to post-injection gel shrinkage, gel height-to-width ratios that can be achieved using injection molding processes are limited.

SUMMARY

One aspect of the present disclosure relates to a sealing apparatus including a carrier and sealant material. The carrier is elongated along a carrier axis and includes a first seal-access side and a second seal-access side. The first and the second seal-access sides face in different directions. The sealant material is carried by the carrier and is accessible from the first seal-access side and the second seal-access side of the carrier. The sealant material is elongated along the carrier axis.

Another aspect of the present disclosure relates to an enclosure interface that includes the sealing apparatus of the preceding paragraph. The enclosure interface includes a first housing piece and a second housing piece that meet at an interface. At least one of the first and the second housing pieces define an enclosure sealing channel that extends along the interface. The sealing apparatus is positioned at least partially within the enclosure sealing channel. When the first and the second housing pieces are mounted together, so as to meet at the interface, the sealant material forms a first interface seal at the first seal-access side with the first housing piece and also forms a second interface seal at the second seal-access side with the second housing piece. The first housing piece may include a first integral sealing projection that embeds in the sealant material to form the first interface seal, and/or the second housing piece may include a second integral sealing projection that embeds in the sealant material to form the second interface seal.

Yet another aspect of the present disclosure relates to an enclosure that includes the above sealing apparatus and a housing. The housing includes a first housing piece and a second housing piece. The first housing piece defines an opening having a perimeter. The first and the second housing pieces mount together to cover the opening. The housing defines an enclosure channel that extends around the perimeter of the opening. The enclosure channel includes at least one primary channel section that is interconnected by at least one junction section. The sealing apparatus is positioned at least partially within the enclosure channel and thereby forms a seal between the first and the second housing pieces along the perimeter of the opening. The carrier of the sealing apparatus is positioned in the at least one primary channel section. The sealant material of the sealing apparatus is a first volume of sealant material. At least one second volume of sealant material is positioned within the at least one junction section of the enclosure channel. The second volume of sealant material is in communication with the first volume of sealant material. When the first and the second housing pieces are mounted together, the first and the second volumes of sealant material form a first seal with the first housing piece that extends continuously around the perimeter of the opening and form a second seal with the second housing piece that extends continuously around the perimeter of the opening.

Still another aspect of the present disclosure relates to a method for installing the sealing apparatus within the above enclosure channel. The method includes positioning at least one of the carriers within the at least one primary channel sections of the enclosure channel and afterwards injecting the at least one second volume of sealant material into the at least one junction section of the enclosure channel. The first volume of sealant material may be pre-installed within the at least one carrier prior to the positioning of the at least one carrier within the at least one primary channel section.

Another aspect of the present disclosure relates to a sealing apparatus including a carrier, a first volume of sealant material, and a second volume of sealant material. The carrier is elongated along a carrier axis. The carrier defines a first carrier channel that is elongated along the carrier axis. The first carrier channel has a first seal-access side. The carrier also defines a second carrier channel that is elongated along the carrier axis. The second carrier channel has a second seal-access side. The first and the second seal-access sides face in different directions. The first volume of sealant material is contained within the first carrier channel. The first volume of sealant material is accessible from the first seal-access side of the first carrier channel. The first volume of sealant material is elongated along the carrier axis. The second volume of sealant material is contained within the second carrier channel. The second volume of sealant material is accessible from the second seal-access side of the second carrier channel. The second volume of sealant material is elongated along the carrier axis. A method for making the sealing apparatus includes extruding the carrier and extruding the first and the second volumes of sealant material into the first and the second carrier channels.

Yet another aspect of the present disclosure relates to an enclosure interface including a first housing piece and a second housing piece that meet at an interface. At least one of the first and the second housing pieces defines an enclosure sealing channel that extends along the interface. A sealing apparatus is positioned within the enclosure sealing channel. The sealing apparatus includes a carrier that defines first and second elongate carrier channels that are elongated along the enclosure sealing channel. The sealing apparatus also includes a first volume of sealant material positioned within the first elongate carrier channel, and a second volume of sealant material positioned within the second elongate carrier channel. When the first and the second housing pieces are mounted together, so as to meet at the interface, the first volume of sealant material forms a first interface seal with the first housing piece and the second volume of sealant material forms a second interface seal with the second housing piece.

Still another aspect of the present disclosure relates to an enclosure including a housing and a sealing arrangement. The housing includes a first housing piece and a second housing piece. The first housing piece defines an opening that has a perimeter. The first and the second housing pieces mount together to cover the opening. The housing defines a first enclosure channel that extends around the perimeter of the opening. The first enclosure channel includes at least one primary channel section that is interconnected to at least one junction section. The sealing arrangement is positioned within the first enclosure channel for forming a seal between the first and the second housing pieces along the perimeter of the opening. The sealing arrangement includes at least one carrier section that defines first and second elongate carrier channels. The at least one carrier section is positioned in the at least one primary channel section. The sealing arrangement also includes at least one first volume of sealant material positioned within the first elongate carrier channel and at least one second volume of sealant material positioned within the second elongate carrier channel. The sealing arrangement further includes at least one third volume of sealant material that is positioned within the at least one junction section of the first enclosure channel. The third volume of sealant material is in communication with the first and the second volumes of sealant material. When the first and the second housing pieces are mounted together, the first and the third volumes of sealant material form a first seal with the first housing piece that extends continuously around the perimeter of the opening. When the first and the second housing pieces are mounted together, the second and the third volumes of sealant material form a second seal with the second housing piece that extends continuously around the perimeter of the opening.

BRIEF DESCRIPTION OF THE DRAWINGS

FIG. 1 is a perspective view of a sealing apparatus according to the principles of the present disclosure;

FIG. 2 is a perspective view of a carrier of the sealing apparatus of FIG. 1;

FIG. 3 is a schematic view of an extrusion machine adapted to produce the sealing apparatus of FIG. 1 according to the principles of the present disclosure;

FIG. 4 is an elevation view of the carrier of FIG. 2;

FIG. 5 is an elevation view of the sealing apparatus of FIG. 1;

FIG. 6 is an exploded perspective view of an enclosure that includes a plurality of the sealing apparatuses of FIG. 1 according to the principles of the present disclosure;

FIG. 7 is an enlarged portion of FIG. 6;

FIG. 8 is a cutaway of FIG. 6;

FIG. 9 is an enlarged portion of FIG. 8;

FIG. 10 is a perspective view of the enclosure of FIG. 6 with the sealing apparatuses of FIG. 6 installed in a housing and with a cover removed from the housing;

FIG. 11 is an enlarged portion of FIG. 10;

FIG. 12 is a cutaway of FIG. 10;

FIG. 13 is an enlarged portion of FIG. 12;

FIG. 14 is the perspective view of FIG. 10 but with a mold tool installed over a portion of the housing and a portion of a pair of the sealing apparatuses of FIG. 1;

FIG. 15 is an enlarged portion of FIG. 14;

FIG. 18 is a cutaway of FIG. 16;

FIG. 19 is an enlarged portion of FIG. 18;

FIG. 20 is the perspective view of FIG. 14 but with junction sections now molded between the sealing apparatuses of FIG. 1;

FIG. 21 is an enlarged portion of FIG. 20;

FIG. 27 is the cutaway perspective view of FIG. 22 but with the mold tool of FIG. 14 now removed and the cover of FIG. 10 installed;

FIG. 28 is an enlarged portion of FIG. 27;

FIG. 31 is a cutaway of FIG. 29;

FIG. 32 is an enlarged portion of FIG. 31;

FIG. 35 is a top plan view of the housing of FIG. 10;

FIG. 36 is a bottom plan view of the cover of FIG. 10;

FIG. 37 is a partial exploded perspective view of an enclosure interface according to the principles of the present disclosure;

FIG. 40 is the partial exploded cross-sectional elevation view of FIG. 38 but with the sealing apparatus of FIG. 39 initially placed in the channel of FIG. 39;

FIG. 41 is the partial exploded perspective view of FIG. 37 but with the sealing apparatus of FIG. 39 properly positioned in the channel of FIG. 39;

FIG. 42 is the partial exploded cross-sectional elevation view of FIG. 38 but with the sealing apparatus of FIG. 39 properly positioned in the channel of FIG. 39;

FIG. 44 is the partial exploded cross-sectional elevation view of FIG. 42 but with the retainer of FIG. 43 installed in the channel of FIG. 39;

FIG. 46 is a partial cross-sectional elevation view of the enclosure interface of FIG. 37 with the sealing apparatus of FIG. 39 installed between the first and the second housing pieces of FIG. 45;

FIG. 47 is a perspective view of the retainer of FIG. 43;

FIG. 48 is a partial side view of the retainer of FIG. 43;

FIG. 49 is a perspective view of still another sealing apparatus according to the principles of the present disclosure;

FIG. 50 is a perspective view of a carrier of the sealing apparatus of FIG. 49;

FIG. 51 is an elevation view of the sealing apparatus of FIG. 49; and

FIG. 52 is an elevation view of the carrier of FIG. 50.

DETAILED DESCRIPTION

Figure 17:
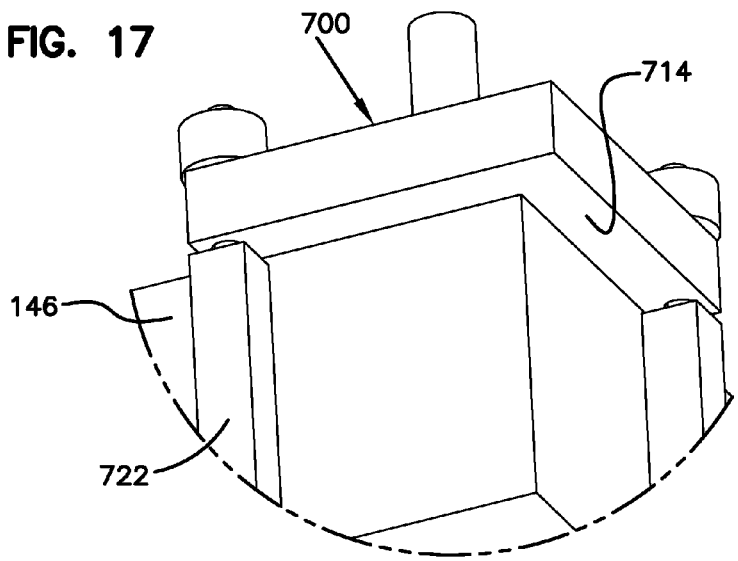
FIG. 17 is an enlarged portion of FIG. 16.
Figure 16:
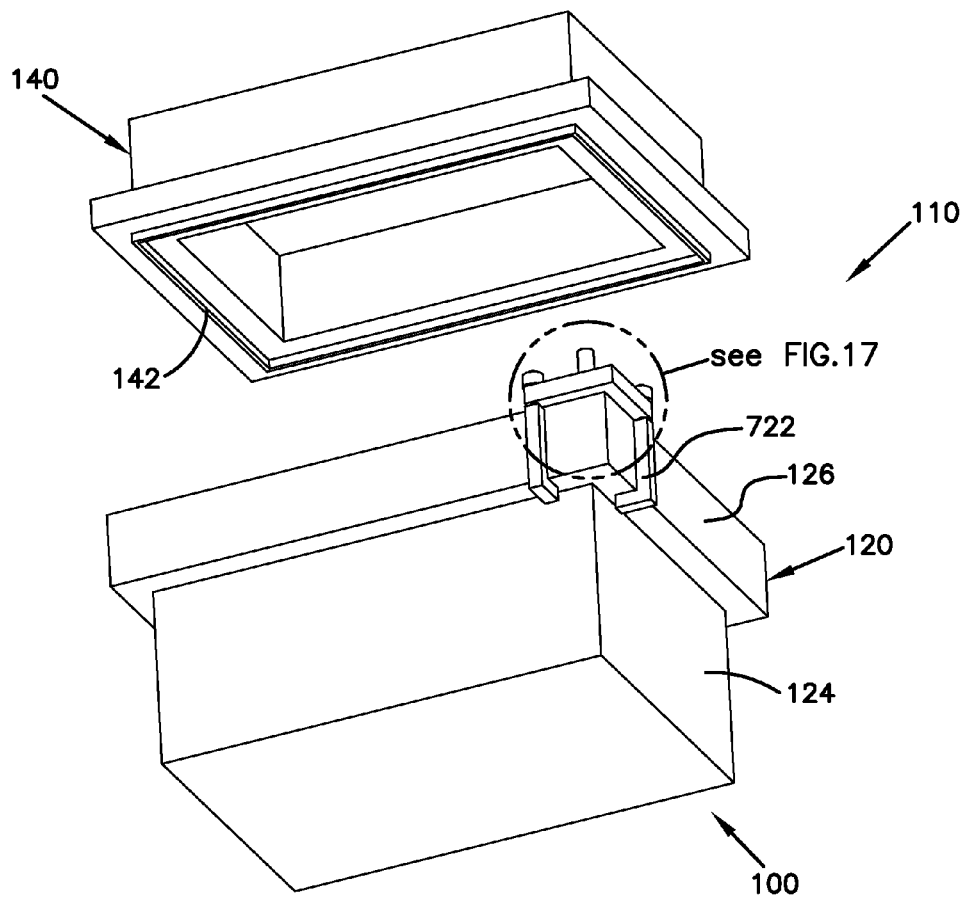
FIG. 16 is another perspective view of the mold tool of FIG. 14 installed over the portions of the housing of FIG. 10 and the sealing apparatuses of FIG. 1.

Reference will now be made in detail to the exemplary aspects of the present disclosure that are illustrated in the accompanying drawings. Wherever possible, the same reference numbers will be used throughout the drawings to refer to the same or like structure. When like structure is included on different embodiments, a prime (') or double prime (") may be appended to the same reference number to indicate the like structure on a different embodiment.

According to the principles of the present disclosure, a sealing arrangement that may be used to seal joints of an enclosure includes an elongated carrier and a sealant material held within the elongated carrier. Such enclosures may be used to house telecommunication components. Such joints, for example, may be positioned between a first piece and a second piece of the enclosure. The first piece, for example, may be a base of the enclosure, and the second piece may be a cover of the enclosure. The elongated carrier may be extruded. The sealant material may be a gel.

Turning now to FIGS. 1 and 5, an example sealing arrangement 500 is illustrated. The sealing arrangement 500 extends from a first end 502 to a second end 504. As depicted, the sealing arrangement 500 includes a first elongate carrier channel 530 and a second elongate carrier channel 550. The first and/or the second carrier channels 530, 550 may be a sealant cavity. The first and/or the second carrier channels 530, 550 may be a sealant receptacle. The first and/or the second carrier channels 530, 550 may be rectangular or almost rectangular in transverse cross-sectional shape. In the depicted embodiment, the first elongate carrier channel 530 opens toward a first seal-access side 506, and the second elongate carrier channel 550 opens toward a second seal-access side 508. In the depicted embodiment, the first seal-access side 506 and the second seal-access side 508 are positioned opposite each other. In other embodiments, the first seal-access side 506 and the second seal-access side 508 may be angled with respect to one another. In still other embodiments, the first seal-access side 506 and the second seal-access side 508 may face in a common direction.

In the depicted embodiment, the first elongate carrier channel 530 and the second elongate carrier channel 550 are included on a carrier 510. The carrier 510 may be a common carrier for both the first elongate carrier channel 530 and the second elongate carrier channel 550. The carrier 510 may be a sealant holder. The carrier 510 may be a sealant containment structure. The carrier 510 may form a carrier section of the sealing arrangement 500. The carrier 510 may extend from a first end 512 to a second end 514. The carrier 510 may include a main body 516. The main body 516 may have a generally H-shaped transverse cross-sectional profile. The generally H-shaped transverse cross-sectional profile may be defined by the carrier 510 when cut along a cross-sectional plane that is perpendicular to a carrier axis Ac. The transverse cross-sectional profile may be defined by a base wall 520 that defines closed ends 518 of the first elongate carrier channel 530 and the second elongate carrier channel 550. As illustrated at FIGS. 2 and 4, a first closed side 518a corresponds with the first elongate carrier channel 530, and a second closed side 518b corresponds with the second elongate carrier channel 550.

The first elongate carrier channel 530 may further include a first opposing side wall 522a and a second opposing side wall 522b that oppose each other and form a first set of opposing side walls. The second elongate carrier channel 550 may include a first side wall 524a and a second side wall 524b that oppose each other and form a second set of opposing side walls. The base wall 520 may include a first side 526c and a second side 528c. As depicted, the first opposing side wall 522a includes an inside surface 526a, and the second opposing side wall 522b includes an inside surface 526b. The inside surface 526a, the inside surface 526b, and the first side 526c of the base wall 520 define the first elongate carrier channel 530. The first side wall 524a includes an inside surface 528a, and the second side wall 524b includes an inside surface 528b. The inside surface 528a, the inside surface 528b, and the second side 528c of the base wall 520 define the second elongate carrier channel 550. In the depicted embodiment, the first elongate carrier channel 530 and the second elongate carrier channel 550 include three of the inside surfaces. In other embodiments, the first elongate carrier channel 530 and the second elongate carrier channel 550 may include more than three inside surfaces or fewer than three inside surfaces. In the depicted embodiment, the inside surfaces 526a-c and 528a-c are generally straight. In other embodiments, the inside surfaces of the first elongate carrier channel 530 and the second elongate carrier channel 550 may be curved. In other embodiments, the first elongate carrier channel 530 and/or the second elongate carrier channel 550 may include a single curved inside surface. As shown at FIG. 5, each channel has a height H and a width W.

As depicted at FIGS. 1 and 5, the carrier 510 is filled with or partially filled with a sealant material 570. In particular, the first elongate carrier channel 530 is filled with or partially filled with a first volume 570a of the sealant material 570. Similarly, the second elongate carrier channel 550 is filled with or partially filled with a second volume 570b of the sealant material 570.

Turning now to FIG. 3, an extrusion machine 800 is schematically illustrated. The extrusion machine 800 is adapted to produce the sealing arrangement 500. In particular, the extrusion machine 800 is adapted to produce extended lengths of the sealing arrangement 500. The extended lengths of the sealing arrangement 500 may be cut to length, as needed, to form the sealing arrangement 500 in lengths appropriate for their intended uses.

In the depicted embodiment, the extrusion machine 800 includes a carrier extruder 810. The carrier extruder 810 includes an inlet 812 and an outlet 814. At the inlet 812, raw material (e.g., plastic granulate) is fed into the carrier extruder 810. For example, as depicted a hopper 816 may be filled with the raw material for the carrier 510. The hopper 816 may allow gravity to feed the raw material into the inlet 812. The carrier extruder 810 may include heaters, grinders, masticators, an extrusion dye, and other components typically found in extruders. The carrier extruder 810 receives the raw material at the inlet 812, processes the raw material into the carrier 510, and forces the carrier 510 out of the outlet 814.

The extrusion machine 800 may further include a material feeder 820. The material feeder 820 may pull on the carrier 510 and thereby assists in the carrier 510 exiting the carrier extruder 810. The assistance provided by the material feeder 820 may be significant, and the carrier 510 may be a pultrusion. The carrier 510 generally exits the carrier extruder 810 along the carrier axis Ac. The material feeder 820 generally moves the carrier 510 in a direction along the carrier axis Ac.

The extrusion machine 800 may include a sealant extruder 830 (e.g., a gel extruder). The sealant extruder 830 includes a carrier inlet 832 and a sealant inlet 834 (e.g., a gel inlet). The sealant extruder 830 further includes an outlet 836. The carrier 510 is fed into the carrier inlet 832. The sealant material 570 is fed into the sealant inlet 834. In the example embodiment, a tank 838 is connected to the sealant inlet 834. The tank 838 may be filled with the sealant material 570. The tank 838 may be pressurized and/or may include a pump and thereby drive the sealant material 570 into the sealant inlet 834. Within the sealant extruder 830, the first volume 570a of the sealant material 570 is placed within the first elongate carrier channel 530, and the second volume 570b of the sealant material 570 is placed within the second elongate carrier channel 550. Upon the sealant material 570 being extruded into the carrier 510, the sealing arrangement 500 is formed. Thereafter, the sealing arrangement 500 exits the outlet 836.

In certain embodiments, the base wall 520 is replaced with a structure that allows passage between the first elongate carrier channel 530 and the second elongate carrier channel 550. In other embodiments, passages are added to the base wall 520 that allow passage between the first elongate carrier channel 530 and the second elongate carrier channel 550.

In certain embodiments, the sealant extruder 830 extrudes a single volume 570' of the sealant material 570 into a carrier 510", without the base wall 520, as illustrated at FIGS. 49-52. In this embodiment, the sealant material 570 can function to hold the side walls together prior to the sealing arrangement being mounted in an enclosure. A sealing arrangement 500" may thereby be produced. The carrier extruder 810 may extrude the carrier 510" or a carrier 510' (see FIG. 37). A sealing arrangement 500' may thereby be produced.

In the depicted embodiment, the sealing arrangement 500, 500', 500" may be flexible and may thereby be wound (i.e., wrapped, rolled, etc.) on a reel 840. In particular, the reel 840 may include a hub 842 that spins about a spool axis As. The hub 842 may define a radius r. The sealing arrangement 500, 500', 500" may be wrapped about the radius r of the hub 842 as the reel 840 spins about the spool axis As. The sealing arrangement 500, 500', 500" may be wrapped directly upon the radius r, and/or the sealing arrangement 500, 500', 500" may be wrapped multiple layers deep about the hub 842. The sealing arrangement 500, 500', 500" may flex as it is wrapped about the hub 842. The sealing arrangement 500, 500', 500" may flex about a section axis. The section axis may be oriented about a variety of orientations of the carrier 510, 510', 510". For example, the section axis may be parallel to the base wall 520. In other embodiments, the section axis may be perpendicular to the base wall 520.

It will be appreciated that the sealant material 570 (i.e., sealants) of the present disclosure may be formed of any one or more of a variety of sealing materials. Elastomers, including natural or synthetic rubbers (e.g., EPDM rubber or silicone rubber) can be used. In further embodiments, the sealant material can be a gasket (e.g., a rubber gasket or other type of elastomeric gasket). In other embodiments, polymeric foam (e.g., open cell or closed cell) such as silicone foam can be used. In other embodiments, mastics can be used. In still other embodiments, the sealing members 570a, 570b, 570' may comprise gel and/or gel combined with another material such as an elastomer. The gel may, for example, comprise silicone gel, urea gel, urethane gel, thermoplastic gel, or any suitable gel or geloid sealing material. Gels are normally substantially volumetrically incompressible (i.e., the gels behave similar to a liquid and experience little to no reduction in volume when placed under pressure); when placed under a compressive force and normally flow and conform to their surroundings thereby forming sealed contact with other surfaces. Example gels include oil-extended polymers. The polymer may, for example, comprise an elastomer, or a block copolymer having relatively hard blocks and relatively elastomeric blocks. Example copolymers include styrene-butadiene or styrene-isoprene di-block or tri-block copolymers. In still other embodiments, the polymer of the gel may include one or more styrene-ethylene-propylene-styrene block copolymers. Example extender oils used in example gels may, for example, be hydrocarbon oils (e.g., paraffinic or naphthenic oils or polypropene oils, or mixtures thereof).

The sealants can also include additives such as moisture scavengers, antioxidants, tackifiers, pigments and/or fungicides. In certain embodiments, sealants 570 in accordance with the principles of the present disclosure have ultimate elongations greater than 100 percent with substantially elastic deformation to an elongation of at least 100 percent. In other embodiments, sealants 570 in accordance with the principles of the present disclosure have ultimate elongations of at least 200 percent, or at least 500 percent, or at least 1,000 percent. Ultimate elongation can be determined by the testing protocol set forth at ASTM D412.

The sealants 570a, 570b, 570' may be any suitable sealants. According to some embodiments, the sealant 570a, 570' is a gel sealant. According to some embodiments, the sealant 570b is a gel sealant. According to some embodiments, both of the sealants 570a, 570b are gel sealants. As used herein, "gel" refers to the category of materials which are solids extended by a fluid extender. The gel may be a substantially dilute system that exhibits no steady state flow. As discussed in Ferry, "Viscoelastic Properties of Polymers," third ed. P. 529 (J. Wiley & Sons, New York 1980), a polymer gel may be a cross-linked solution whether linked by chemical bonds or crystallites or some other kind of junction. The absence of the steady state flow may be considered to be the definition of the solid-like properties while the substantial dilution may be necessary to give the relatively low modulus of gels. The solid nature may be achieved by a continuous network structure formed in the material generally through crosslinking the polymer chains through some kind of junction or the creation of domains of associated substituents of various branch chains of the polymer. The crosslinking can be either physical or chemical as long as the crosslink sites may be sustained at the use conditions of the gel.

Gels for use in this disclosure may be silicone (organopolysiloxane) gels, such as the fluid-extended systems taught at U.S. Pat. No. 4,634,207 to Debbaut (hereinafter "Debbaut '207"); U.S. Pat. No. 4,680,233 to Camin et al.; U.S. Pat. No. 4,777,063 to Dubrow et al.; and U.S. Pat. No. 5,079,300 to Dubrow et al. (hereinafter "Dubrow '300"), the disclosures of each of which are hereby incorporated herein by reference in their entirety. These fluid-extended silicone gels may be created with nonreactive fluid extenders as in the previously recited patents or with an excess of a reactive liquid, e.g., a vinyl-rich silicone fluid, such that it acts like an extender, as exemplified by the Sylgarde 200 product commercially available from Dow-Corning of Midland, Mich. or as disclosed at U.S. Pat. No. 3,020,260 to Nelson. Because curing is generally involved in the preparation of these gels, they are sometimes referred to as thermosetting gels. The gel may be a silicone gel produced from a mixture of divinyl terminated polydimethylsiloxane, tetrakis (dimethylsiloxy)silane, a platinum divinyltetramethyldisiloxane complex, commercially available from United Chemical Technologies, Inc. of Bristol, Pa., polydimethylsiloxane, and/or 1,3,5,7-tetravinyltetra-methylcyclotetrasiloxane (reaction inhibitor for providing adequate pot life).

Other types of gels may be used, for example, polyurethane gels as taught in the aforementioned Debbaut '261 and U.S. Pat. No. 5,140,476 to Debbaut (hereinafter "Debbaut '476") and gels based on styrene-ethylene butylenestyrene (SEBS) or styrene-ethylene propylene-styrene (SEPSS) extended with an extender oil of naphthenic or nonaromatic or low aramatic content hydrocarbon oil, as described in U.S. Pat. No. 4,369,284 to Chen; U.S. Pat. No. 4,716,183 to Gamarra et al.; and U.S. Pat. No. 4,942,270 to Gamarra. The SEBS and SEPS gels comprise glassy styrenic microphases interconnected by a fluid-extended elastomeric phase. The microphase-separated styrenic domains serve as the junction points in the systems. The SEBS and SEPS gels are examples of thermoplastic systems.

Another class of gels which may be used are EPDM rubber-based gels, as described in U.S. Pat. No. 5,177,143 to Chang et al.

Yet another class of gels which may be used is based on anhydride-containing polymers, as disclosed in WO 96/23007. These gels reportedly have good thermal resistance.

The gel may include a variety of additives, including stabilizers and antioxidants such as hindered phenols (e.g., Irganox™ 1076, commercially available from Ciba-Geigy Corp. of Tarrytown, N.Y.), phosphites (e.g., Irgafos™ 168, commercially available from Ciba-Geigy Corp. of Tarrytown, N.Y.), metal deactivators (e.g., Irganox™ D1024 from Ciba-Geigy Corp. of Tarrytown, N.Y.), and/or sulfides (e.g., Cyanox LTDP, commercially available from American Cyanamid Co. of Wayne, N.J.), light stabilizers (e.g., Cyasorb UV-531, commercially available from American Cyanamid Co. of Wayne, N.J.), and/or flame retardants such as halogenated paraffins (e.g., Bromoklor 50, commercially available from Ferro Corp. of Hammond, Ind.), and/or phosphorous containing organic compounds (e.g., Fyrol PCF and Phosflex 390, both commercially available from Akzo Nobel Chemicals Inc. of Dobbs Ferry, N.Y.) and/or acid scavengers (e.g., DHT-4A, commercially available from Kyowa Chemical Industry Co. Ltd through Mitsui & Co. of Cleveland, Ohio, and hydrotalcite). Other suitable additives include colorants, biocides, tackifiers and the like described in "Additives for Plastics, Edition 1" published by D.A.T.A., Inc. and The International Plastics Selector, Inc., San Diego, Calif.

The hardness, stress relaxation, and tack may be measured using a Texture Technologies Texture Analyzer TA-XT2 commercially available from Texture Technologies Corp. of Scarsdale, N.Y., or like machines, having a five kilogram load cell to measure force, a 5 gram trigger, and ¼ inch (6.35 mm) stainless steel ball probe as described in Dubrow '300, the disclosure of which is incorporated herein by reference in its entirety. For example, for measuring the hardness of a gel a 60 mL glass vial with about 20 grams of gel, or alternately a stack of nine 2 inch×2 inch×⅛" thick slabs of gel, is placed in the Texture Technologies Texture Analyzer and the probe is forced into the gel at the speed of 0.2 millimeter/second to a penetration distance of 4.0 millimeter. The hardness of the gel is indicated by the force in grams, as recorded by a computer, required to force the probe at that speed to penetrate or deform the surface of the gel specified for 4.0 mm. Higher numbers signify harder gels. The data from the Texture Analyzer TA-XT2 may be analyzed on an IBM PC or like computer, running Microsystems Ltd, XT.RA Dimension Version 2.3 software.

The tack and stress relaxation are read from the stress curve generated when the XT.RA Dimension version 2.3 software automatically traces the force versus time curve experienced by the load cell when the penetration speed is 2.0 mm/second and the probe is forced into the gel a penetration distance of about 4.0 mm. The probe is held at 4.0 mm penetration for 1 minute and withdrawn at a speed of 2.00 millimeters/second. The stress relaxation is the ratio of the initial force ($F_i$) resisting the probe at the pre-set penetration depth minus the force resisting the probe ($F_f$) after 1 minute divided by the initial force $F_i$, expressed as a percentage. That is, percent stress relaxation is equal to $((F_i-F_f)/F_i) \times 100\%$ where $F_i$ and $F_f$ are in grams. In other words, the stress relaxation is the ratio of the initial force minus the force after 1 minute over the initial force. It may be considered to be a measure of the ability of the gel to relax any induced compression placed on the gel. The tack may be considered to be the amount of force in grams resistance on the probe as it is pulled out of the gel when the probe is withdrawn at a speed of 2.0 millimeters/second from the preset penetration depth.

An alternative way to characterize the gels is by cone penetration parameters according to ASTM D-217 as proposed in Debbaut '261; Debbaut '207; Debbaut '746; and U.S. Pat. No. 5,357,057 to Debbaut et al., each of which is incorporated herein by reference in its entirety. Cone penetration ("CP") values may range from about 70 ($10^{-1}$ millimeter) to about 400 ($10^{-1}$ millimeter). Harder gels may generally have CP values from about 70 ($10^{-1}$ millimeter) to about 120 ($10^{-1}$ millimeter). Softer gels may generally have CP values from about 200 ($10^{-1}$ millimeter) to about 400 ($10^{-1}$ millimeter), with particularly preferred range of from about 250 ($10^{-1}$ millimeter) to about 375 ($10^{-1}$ millimeter). For a particular materials system, a relationship between CP and Voland gram hardness can be developed as proposed in U.S. Pat. No. 4,852,646 to Dittmer et al.

According to some embodiments, the gel has a Voland hardness, as measured by a texture analyzer, of between about 5 and 100 grams force. The gel may have an elongation, as measured by ASTM D-638, of at least 55%. According to some embodiments, the elongation is at least 100%. The gel may have a stress relaxation of less than 80%. The gel may have a tack greater than about 1 gram. Suitable gel materials include POWERGEL sealant gel available from Tyco Electronics Energy Division of Fuquay-Varina, North Carolina under the RAYCHEM brand.

While, in accordance with some embodiments, the sealants 570a, 570b, 570' are gels as described above, other types of sealants may be employed. For example, the sealants 570a, 570b, 570' may be silicone grease and/or hydrocarbon-based grease.

The sealant 570a (i.e., the first volume 570a) may have different physical properties and/or different chemical formulations than the sealant 570b (i.e., the second volume 570b). In particular, properties such as elongation properties, tackiness properties, flowability properties, material compatibility properties, etc. may be different and distinct between the first volume 570a and the second volume 570b.

The sealant 570' may have different physical properties and/or different chemical formulations arranged along a gradient. In particular, properties such as elongation properties, tackiness properties, flowability properties, material compatibility properties, etc. may be different and distinct between different portions of the sealant 570'.

The sealant material 570 may be substantially volumetrically incompressible. By being substantially volumetrically incompressible, the sealant material 570 exhibits hydraulic characteristics similar to or the same as a liquid when placed under pressure.

Turning now to FIGS. 6-28, 35, and 36, an enclosure 100, according to the principles of the present disclosure, is illustrated. The enclosure 100 includes a housing 110 that includes a first housing piece 120 and a second housing piece 140. In the depicted embodiment, the first housing piece 120 forms a main portion of the housing 110, and the second housing piece 140 forms a cover. According to the principles of the present disclosure, the sealing arrangement 500 forms a seal between the first housing piece 120 and the second housing piece 140 when the second housing piece 140 is attached to the first housing piece 120. In particular, a first sealing apparatus 500a, a second sealing apparatus 500b, a third sealing apparatus 500c, and a fourth sealing apparatus 500d are used to seal the first housing piece 120 with the second housing piece 140. As illustrated, the sealing apparatuses 500a-d are straight and meet at corners. As explained in detail below, a third volume 570c of the sealant material 570 may be included at the corners (see FIGS. 20 and 21). The third volume 570c of the sealant material 570 may have different properties from the first volume 570a and/or the second volume 570b of the sealant material 570.

In the depicted embodiment the first housing piece 120 includes an opening 130 that defines a perimeter 132 (see FIG. 14). As depicted, the perimeter 132 is included on a flange 126 (see FIG. 6). The flange 126 terminates a wall 124 of the first housing piece 120. A set of channels 134 are included in the flange 126 along the perimeter 132. In particular, the set of the channels 134 includes a first channel 134a, a second channel 134b, a third channel 134c, and a fourth channel 134d (see FIG. 35). The set of the channels 134 are joined by a set of junctions 136. In particular, a first junction 136a is positioned between the first channel 134a and the fourth channel 134d, a second junction 136b is positioned between the second channel 134b and the first channel 134a, a third junction 136c is positioned between the third channel 134c and the second channel 134b, and a fourth junction 136d is positioned between the fourth channel 134d and the third channel 134c. As depicted the set of the junctions 136 are positioned at corners 138 of the flange 126. In particular, the first junction 136a is positioned at a first corner 138a, the second junction 136b is positioned at a second corner 138b, the third junction 136c is positioned at a third corner 138c, and the fourth junction 136d is positioned at a fourth corner 138d.

In the depicted embodiment, a sealing projection 122 runs along the perimeter 132. In particular, the sealing projection 122 is positioned within the channels 134. As depicted, the sealing projection 122 extends toward the second housing piece 140 when the second housing piece 140 is positioned on the first housing piece 120. As depicted, the first housing piece 120 includes a first sealing projection 122a positioned within the first channel 134a, a second sealing projection 122b positioned within the second channel 134b, a third sealing projection 122c positioned within the third channel 134c, and a fourth sealing projection 122d positioned within the fourth channel 134d. As depicted, the sealing projections 122a-d intersect with each other at the corners 138 to form a continuous, uninterrupted structure that extends along the perimeter. The sealing projections 122, 122a-d may be or may include a sealing blade or a fin, etc. The sealing projections 122, 122a-d may be relatively thin. For example, a ratio of height to thickness may be greater than 2:1, greater than 3:1, or greater than 4:1.

Figure 26:
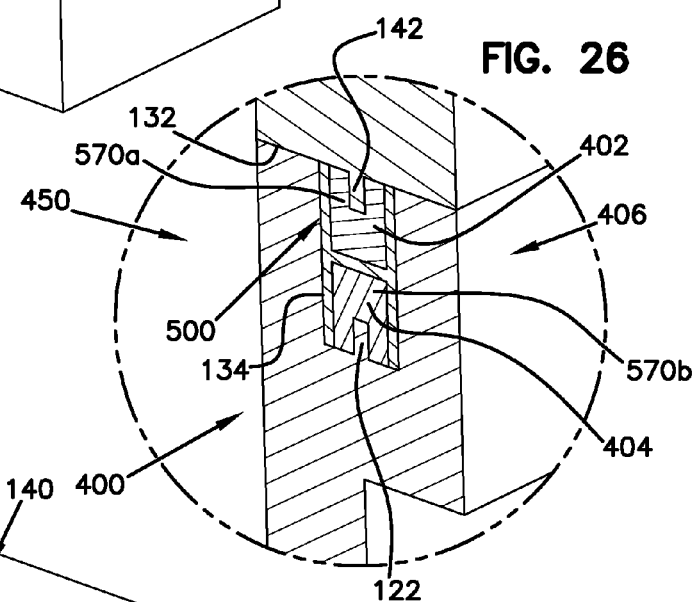
FIG. 26 is an enlarged portion of FIG. 25.
Figure 25:
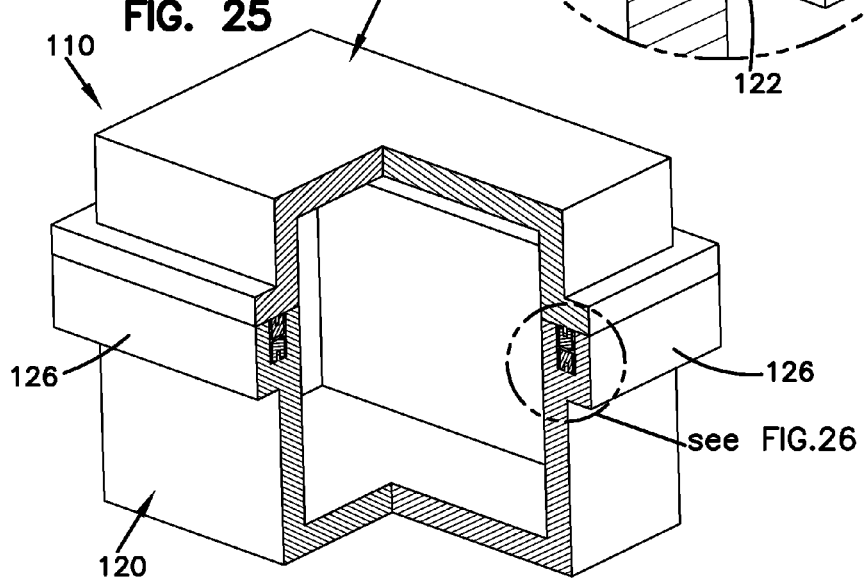
FIG. 25 is a cutaway of FIG. 24.

In the depicted embodiment, a sealing projection 142 of the second housing piece 140 also runs along the perimeter 132 when the first housing piece 120 and the second housing piece 140 are assembled (see FIGS. 25 and 26). In particular, the sealing projection 142 is positioned on a flange 146 of the second housing piece 140 (see FIG. 8). As depicted, the sealing projection 142 extends toward the first housing piece 120 when the second housing piece 140 is positioned on the first housing piece 120. As depicted, the second housing piece 140 includes a first sealing projection 142a, a second sealing projection 142b, a third sealing projection 142c, and a fourth sealing projection 142d. As depicted, the sealing projections 142a-d intersect with each other at corners to form a continuous, uninterrupted structure that extends along the perimeter. The sealing projections 142, 142a-d may be or may include a sealing blade or a fin, etc. The sealing projections 142, 142a-d may be relatively thin. For example, a ratio of height to thickness may be greater than 2:1, greater than 3:1, or greater than 4:1.

As depicted at FIG. 26, the sealing projection 122 embeds in the sealant material 570 and the sealing projection 142 embeds in the sealant material 570 when the second housing piece 140 is assembled to the first housing piece 120. In particular, the sealing projection 122 embeds in the sealant material 570b, and the sealing projection 142 embeds in the sealant material 570a. By the sealing projection 122 and the sealing projection 142 embedding in the sealant material 570, a seal is formed between an interior of the enclosure 100 and the environment (i.e., an exterior). The seal may provide many or all of the benefits of the aforementioned seals that provide perimeter seals between bases and covers of enclosures and/or seals provided at other types of interfaces between housing pieces of an enclosure. The sealant material 570 may include gels such as the aforementioned gels. The seal may be included in a sealing arrangement 400, as illustrated at FIGS. 26 and 28. The sealing arrangement 400 includes a seal 402 that seals with the second housing piece 140, and a seal 404 that seals with the first housing piece 120. The sealant material 570 is generally self-sealing with respect to itself and thereby completes the seal between the seal 402 and the seal 404. In particular, in the embodiment depicted at FIGS. 1, 5, 25, and 26, the sealant material 570a provides a seal between the second housing piece 140 and the carrier 510. Likewise, the sealant material 570b provides a seal between the first housing piece 120 and the carrier 510. The sealant material 570a may adhere to the inside wall 526a, the closed side 518a, and the inside wall 526b. Likewise, the sealant material 570b may adhere to the inside wall 528a, the closed side 518b, and the inside wall 528b.

According to the principles of the present disclosure, a seal 406 is provided between the ends 502, 504 of the sealing apparatuses 500 (e.g., 500a, 500b, 500c, and 500d). As illustrated at FIGS. 1, 2, and 7, the ends 502, 504 of the sealing apparatuses 500 are generally perpendicular to the carrier axis Ac. In other embodiments, the ends 502, 504 may be angled with respect to the carrier axis Ac. In certain embodiments, the ends 502, 504 may be mitered and fit tightly against the adjacent end 502, 504. In embodiments where the ends 502, 504 fit tightly together, the ends 502, 504 may seal against each other. In other embodiments, as illustrated at FIG. 7, the ends 502, 504 may not necessarily fit tight against each other. In such embodiments, the seal 406 may be provided by the sealant material 570c. The sealant material 570c may be injection molded between and/or around the ends 502, 504, as described in detail below.

Turning now to FIGS. 6-28, a sequence of installing the sealing apparatuses 500 in the enclosure 100 is illustrated. In particular, as illustrated at FIG. 6, the sealing apparatuses 500a-d are positioned adjacent the first housing piece 120 before installation into the channels 134a-d. In the depicted embodiment, the seal-access side 508 generally faces toward the first housing piece 120. As illustrated at FIGS. 10-13, the sealing apparatuses 500a-d are installed in the channels 134a-d, respectively. As depicted, the carrier 510 fits snugly between a first channel side 150a and a second channel side 150b (see FIG. 9). In the depicted embodiment, the sealing apparatuses 500a-d are inserted until they reach a bottom 148 of the channels 134a-d. In the depicted embodiment, the sealing apparatuses 500a-d are generally flush with a mating surface of the flange 126 upon installation of the sealing apparatuses 500a-d into the channels 134a-d. As illustrated at FIG. 13, the sealing projection 122 has penetrated the sealant material 570 and, in particular, the sealant material 570b upon the installation of the sealing apparatuses 500a-d into the channels 134a-d. The sealing apparatuses 500, 500a-d may be retained within the channels 134, 134a-d by a friction fit. The sealing apparatuses 500, 500a-d may be compressed (e.g., deformed) upon installation into the channels 134, 134a-d and thereby provide the friction fit. In particular, the base wall 520, or other cross-structure, may deform, spring, compress, etc.

As illustrated at FIGS. 12, 14, and 35, the junctions 136, 136a-d are unsealed upon the installation of the sealing apparatuses 500a-d into the channels 134a-d. The sealant material 570c may be injected into the junction 136, 136a-d and thereby seal the ends 502, 504 of the sealing apparatuses 500, 500a-d to each other and thereby complete the sealing arrangement 400 with respect to the first housing piece 120. As illustrated at FIGS. 14 and 15, an injection mold 700 may be provided to inject the sealant material 570c into the junctions 136, 136a-d.

Figure 23:
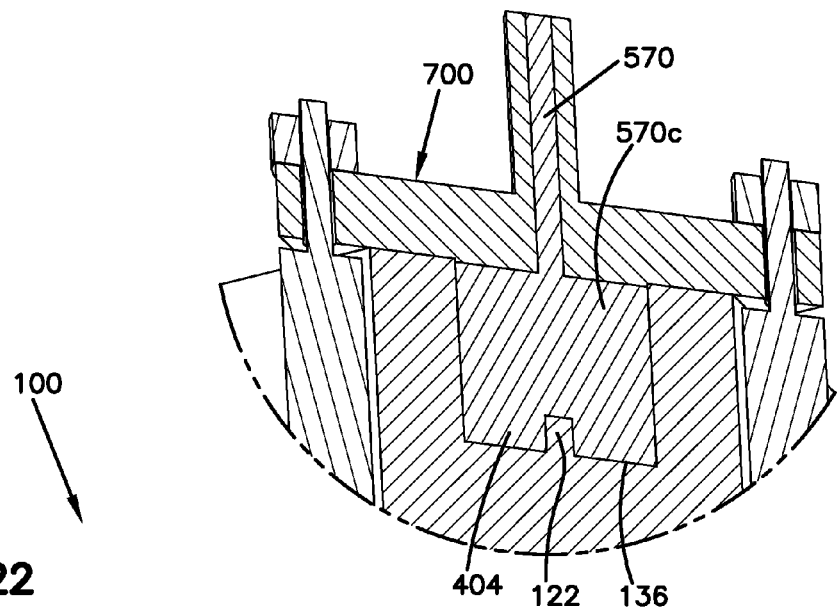
FIG. 23 is an enlarged portion of FIG. 22.
Figure 22:
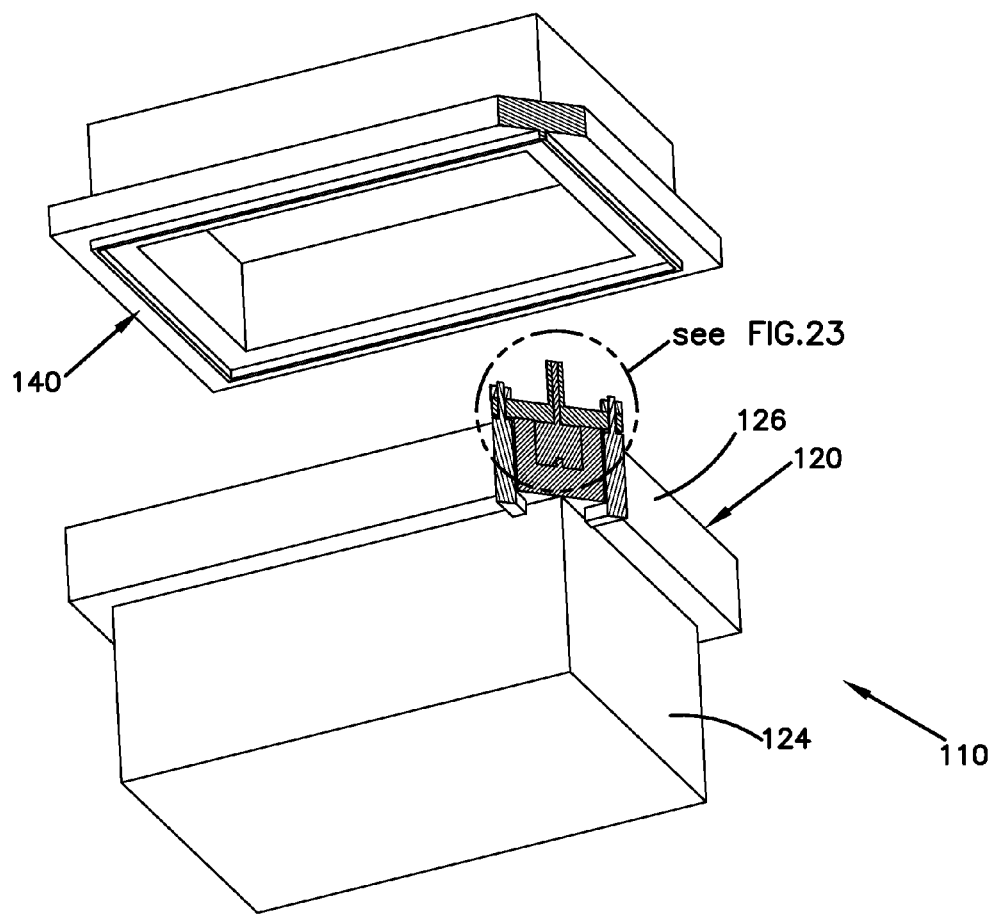
FIG. 22 is the cutaway perspective view of FIG. 18 but with the junction sections of FIG. 20 now molded between the sealing apparatuses of FIG. 1.
Figure 24:
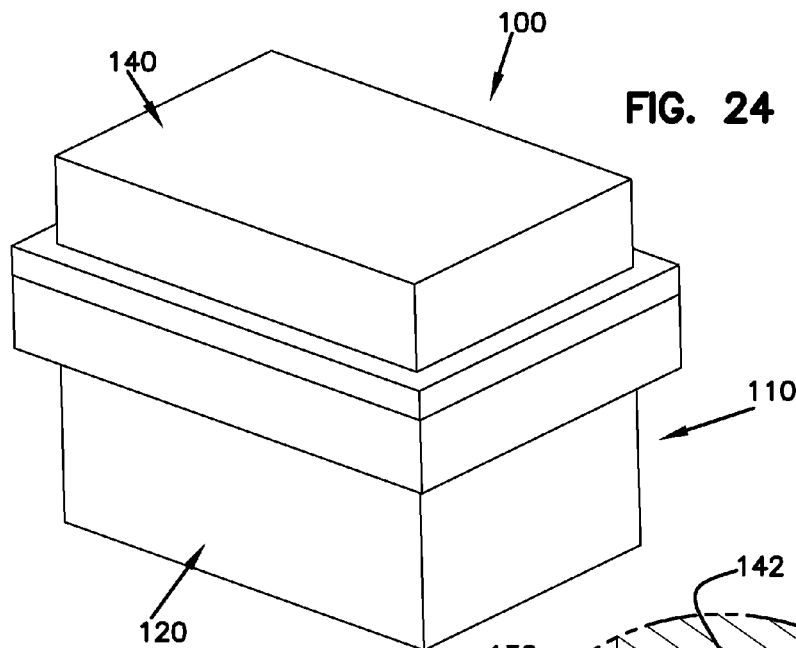
FIG. 24 is a perspective view of the enclosure of FIG. 6 with the cover of FIG. 10 installed and the sealing apparatuses of FIG. 1 installed and the junction sections of FIG. 20 molded.

The injection mold 700 may include an inlet 710, a vent 712, a flange mount 714, a seal interface 716, a carrier interface 718, a sealant interface 720 (e.g., a gel interface), and a clamp 722. The injection mold 700 is generally positioned over the junction 136, 136a-d and secured to the first housing piece 120. As illustrated, the injection mold 700 is secured to the flange 146 by one or more of the clamps 722 (see FIGS. 16 and 17). In the depicted embodiment, the flange mount 714 is mounted to the mating surface of the flange 146. As the sealing apparatuses 500, 500a-d have been installed within the channels 134, 134a-d, the carrier interface 718 of the injection mold 700 is positioned against the carrier 510, and the seal interface 716 is positioned adjacent the sealant material 570a of the sealing apparatuses 500. Upon securing the injection mold 700 to the channels 134 and the sealing apparatuses 500, additional sealant material 570 is injected through the inlet 710 (see FIG. 23). Air may escape the junction 136 by exiting the vent 712 (see FIG. 15). As illustrated at FIGS. 19 and 23, the sealant material 570c encapsulates the ends 502, 504 of the sealing apparatuses 500, 500a-d and further encapsulates a portion (e.g., a corner portion) of the sealing projection 122, 122a-d. The sealant material 570 further encapsulates a first end 572 and/or a second end 574 of the sealant material 570, 570a, 570b contained within the carrier 510, 510', 510". The sealant material 570a, the sealant material 570b, and the sealant material 570c, thereby provide a continuous seal around the perimeter 132. The injection mold 700 may be repeatedly used at all of the junctions 136 until the sealing arrangement 400 extends around the perimeter 132.

The injection mold 700 can be made to be standardized and thereby fit a variety of enclosures such as the enclosure 100. The variety of the enclosures can include a variety of shapes and sizes, but yet be compatible with the injection mold 700. The variety of the enclosures may further be compatible with the sealing apparatuses 500, cut at various lengths. As the variety of the enclosures may be accommodated and sealed by the sealing apparatuses 500 and the sealant material 570c injected by the injection mold 700, additional molds are not required thus saving time and expense of developing and building custom molds to custom fit the various enclosures.

Figure 30:
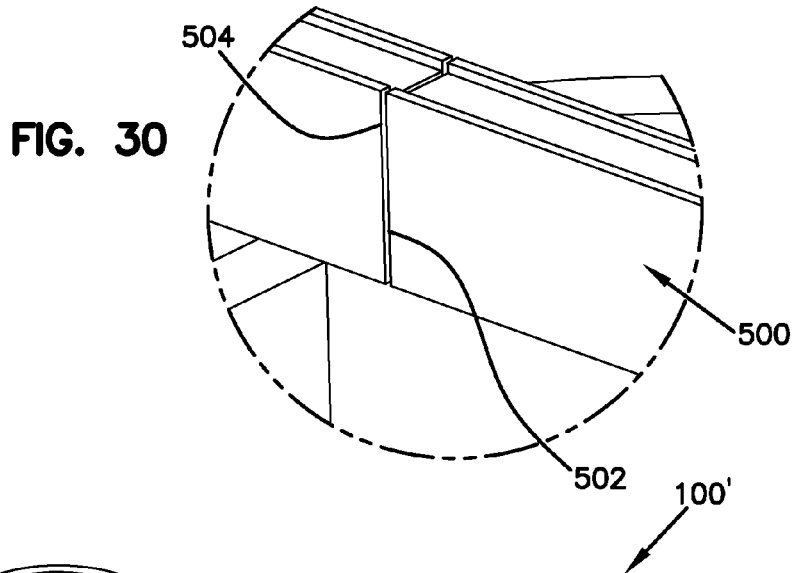
FIG. 30 is an enlarged portion of FIG. 29.
Figure 29:
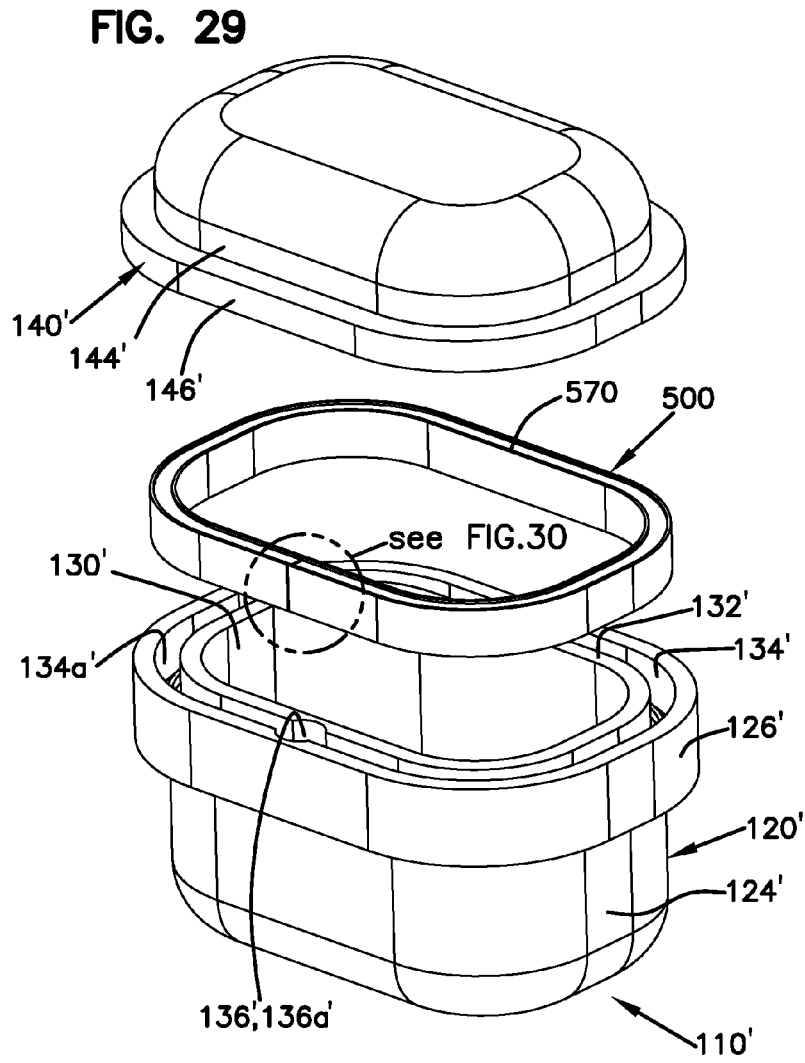
FIG. 29 is an exploded perspective view of another enclosure that includes a single one of the sealing apparatus of FIG. 1 according to the principles of the present disclosure.
Figure 34:
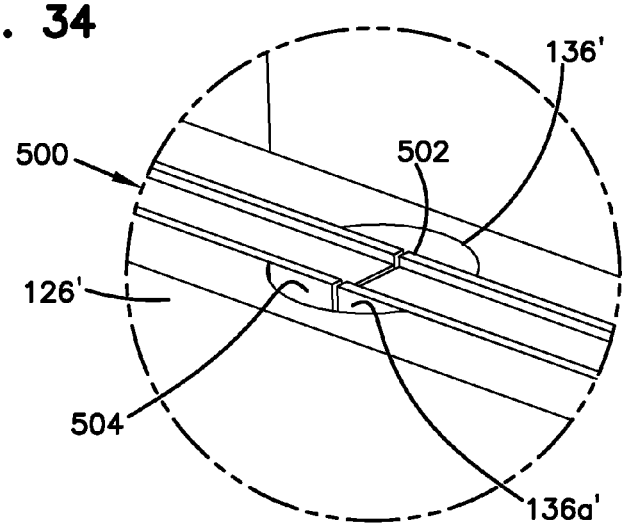
FIG. 34 is an enlarged portion of FIG. 33.
Figure 33:
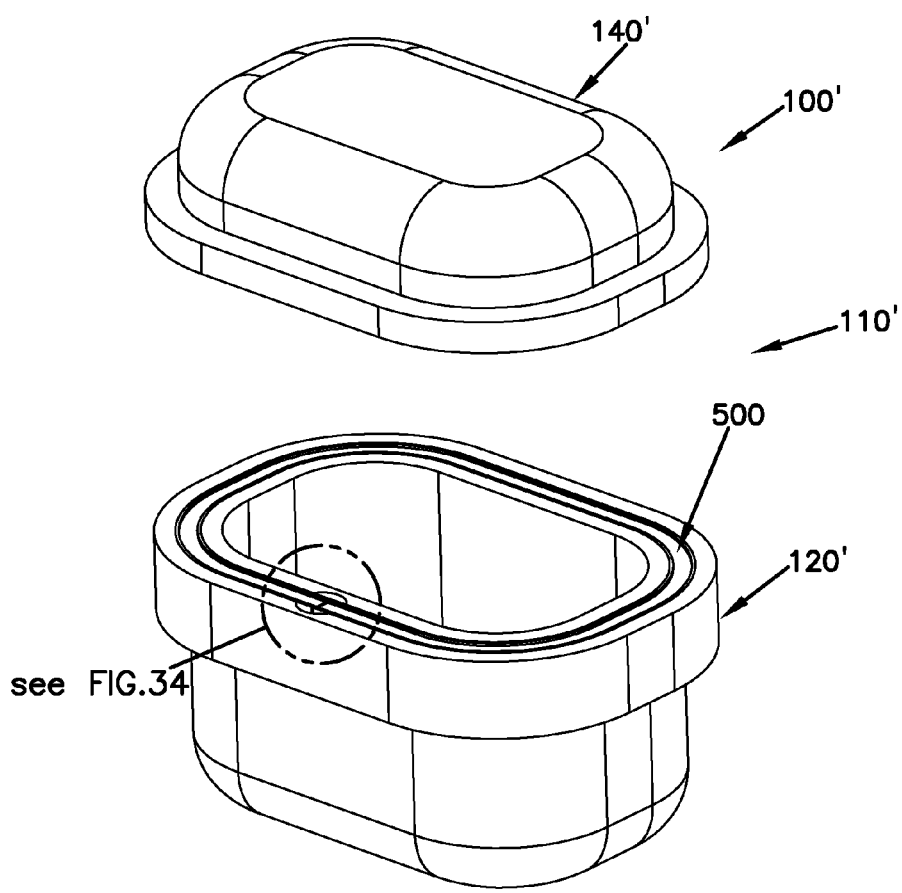
FIG. 33 is a perspective view of the enclosure of FIG. 29 with the single sealing apparatus of FIG. 1 installed in a housing and with a cover removed from the housing.

In the preceding embodiment of FIGS. 6-28, four of the sealing apparatuses 500a-d were used to seal the first housing piece 120 to the second housing piece 140. In addition, the embodiment of FIGS. 6-28 illustrated the sealing apparatuses 500 as straight sealing apparatuses. According to the principles of the present disclosure, the sealing arrangement 400 may include a single sealing apparatus 500 as illustrated at FIGS. 29-34. The embodiment of FIGS. 29-34 includes an enclosure 100' similar to the enclosure 100. The enclosure 100' includes a housing 110' similar to the housing 110, a first housing piece 120' similar to the first housing piece 120, and a second housing piece 140' similar to the second housing piece 140. In general, the features of the first housing piece 120' and the second housing piece 140' are numbered with the same base numbers as the first housing piece 120 and the second housing piece 140, but include the addition of a single prime ('). As depicted, the enclosure 100' includes the sealing apparatus 500 cut to a length generally equal to a perimeter 132' of an opening 130' of the first housing piece 120'. As depicted, the sealing apparatuses 500 is flexed to follow the perimeter 132' and then installed into a channel 134' of a flange 126' of the first housing piece 120'. As illustrated at FIG. 30, the end 502 and the end 504 of the sealing apparatuses 500 are adjacent each other. In certain embodiments, the end 502 and the end 504 fit tightly against each other and provide a seal against each other. In the depicted embodiment, a junction 136' is provided between the end 502 and the end 504. As depicted, the enclosure 100' includes a single junction 136'. As illustrated in the embodiment of FIGS. 6-28, the junction 136' may be injected with the sealant material 570c. An injection mold similar to or the same as the injection mold 700 may be used to inject the sealant material 570c into the junction 136'. The sealant material 570c may seal the end 502 and the end 504 of the same sealing apparatuses 500 to each other.

According to the principles of the present disclosure, additional features are illustrated at an embodiment illustrated at FIGS. 37-46. In particular, an apparatus and method are provided that include a cover structure 580 to the sealing apparatus 500' and further include a retaining apparatus and method including a retainer 600 for securing the sealing apparatuses 500' in a channel 134". In addition, the embodiment of FIGS. 37-46 include features that protect a sealing projection 142" of a second housing piece 140" similar to the second housing piece 140 and the second housing piece 140'. The sealing projection 142" may thereby be included in (i.e., recessed within or contained in) a sealing channel 154 of the second housing piece 140".

The sealing apparatuses 500' may be generally similar to the sealing apparatuses 500. As depicted, the sealing apparatus 500' further includes a retaining tab 532 with a lead-in 534 and a retaining tab 552 with a pivot surface 554. The sealing apparatus 500' may further include the cover structure 580.

The cover structure 580 is illustrated at a closed position 582 at FIGS. 37-44. The cover structure 580 is illustrated at an open position 584 at FIGS. 45 and 46. As depicted, the cover structure 580 includes a pair of flaps 590. In particular, a first flap 590*a* includes a base end 592 attached to the carrier 510' of the sealing apparatuses 500', and a second flap 590*b* includes a base end 592 attached to the carrier 510' of the sealing apparatuses 500'. The flaps 590, 590*a*, 590*b* further includes a free end 594 positioned opposite the base end 592. As depicted, the first flap 590*a* and the second flap 590*b* meet with their free ends 594 positioned adjacent each other when the cover structure 580 is in the closed position 582. The cover structure 580 thereby prevents contaminates from entering the sealant material 570, 570*a* when the second housing piece 140" is not mounted to the first housing piece 120". However, the cover structure 580 does not interfere with the sealing projections 142" embedding into the sealant material 570, and, in particular, the sealant material 570*a*. As illustrated at FIGS. 44 and 46, when the second housing piece 140" is installed on the first housing piece 120", the sealing projection 142" penetrates the cover structure 580 and embeds into the sealant material 570*a*. The cover structure 580 is further configured to allow the withdrawal of the second housing piece 140" from the first housing piece 120". As depicted, the cover structure 580 is provided on the seal-access side 506 of the sealing apparatuses 500'. In the depicted embodiment, the sealing apparatuses 500' typically stays with the first housing piece 120" as the second housing piece 140" and the first housing piece 120" are assembled and disassembled. The cover structure 580 may return to the closed position 582 upon the first housing piece 120" and the second housing piece 140" being disassembled. In other embodiments, the cover structure 580 may be provided at the seal-access side 506 and the seal-access side 508 of the sealing apparatuses 500'.

The retainer 600 includes a first end 602, a second end 604, a first edge 606, a second edge 608, and a retaining member 610 or members 610 (e.g., a barb or barbs). The retainer 600 may be used to retain the sealing apparatuses 500' within the channels 134".

Figure 38:
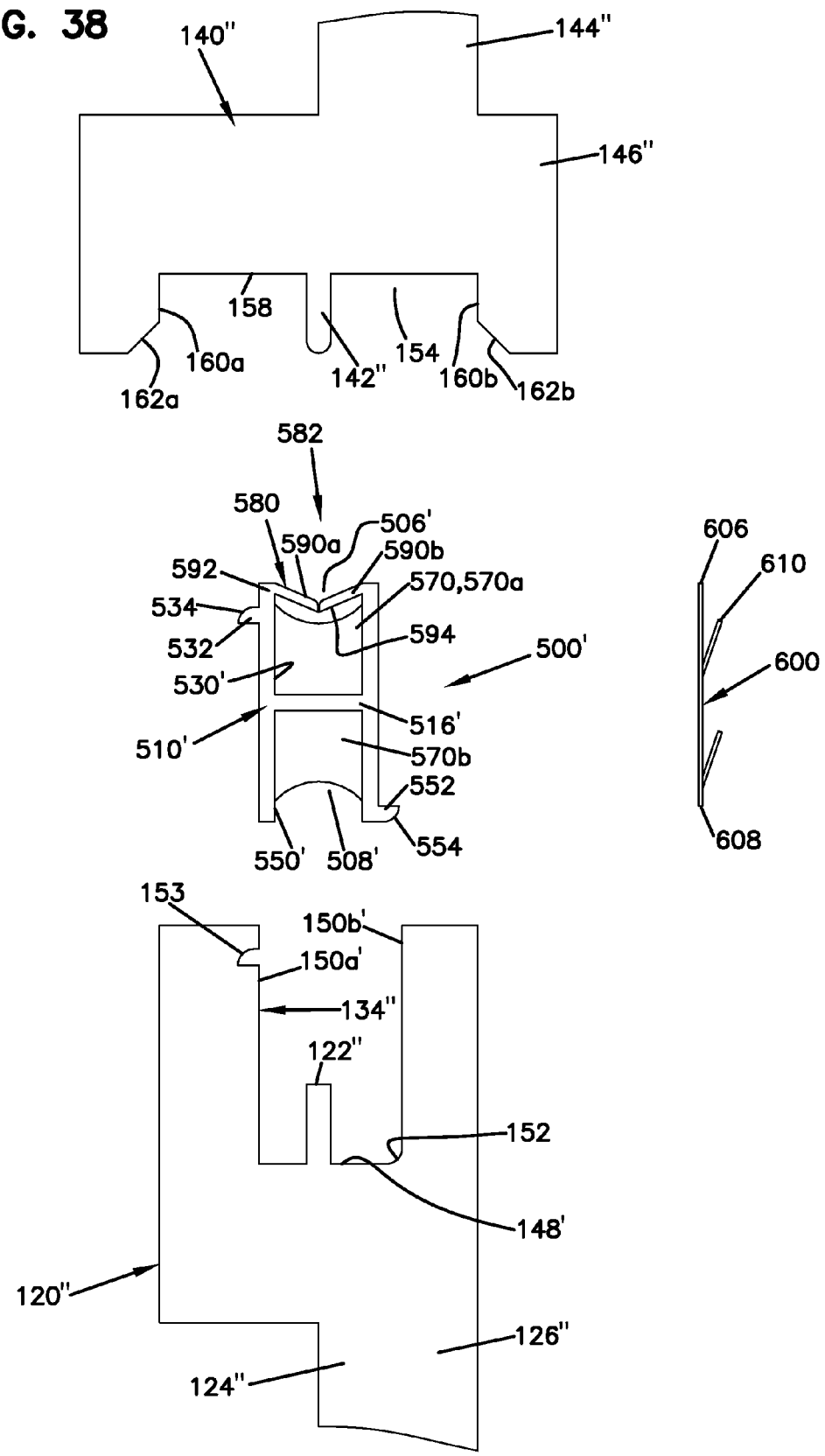
FIG. 38 is a partial exploded cross-sectional elevation view of the enclosure interface of FIG. 37.
Figure 39:
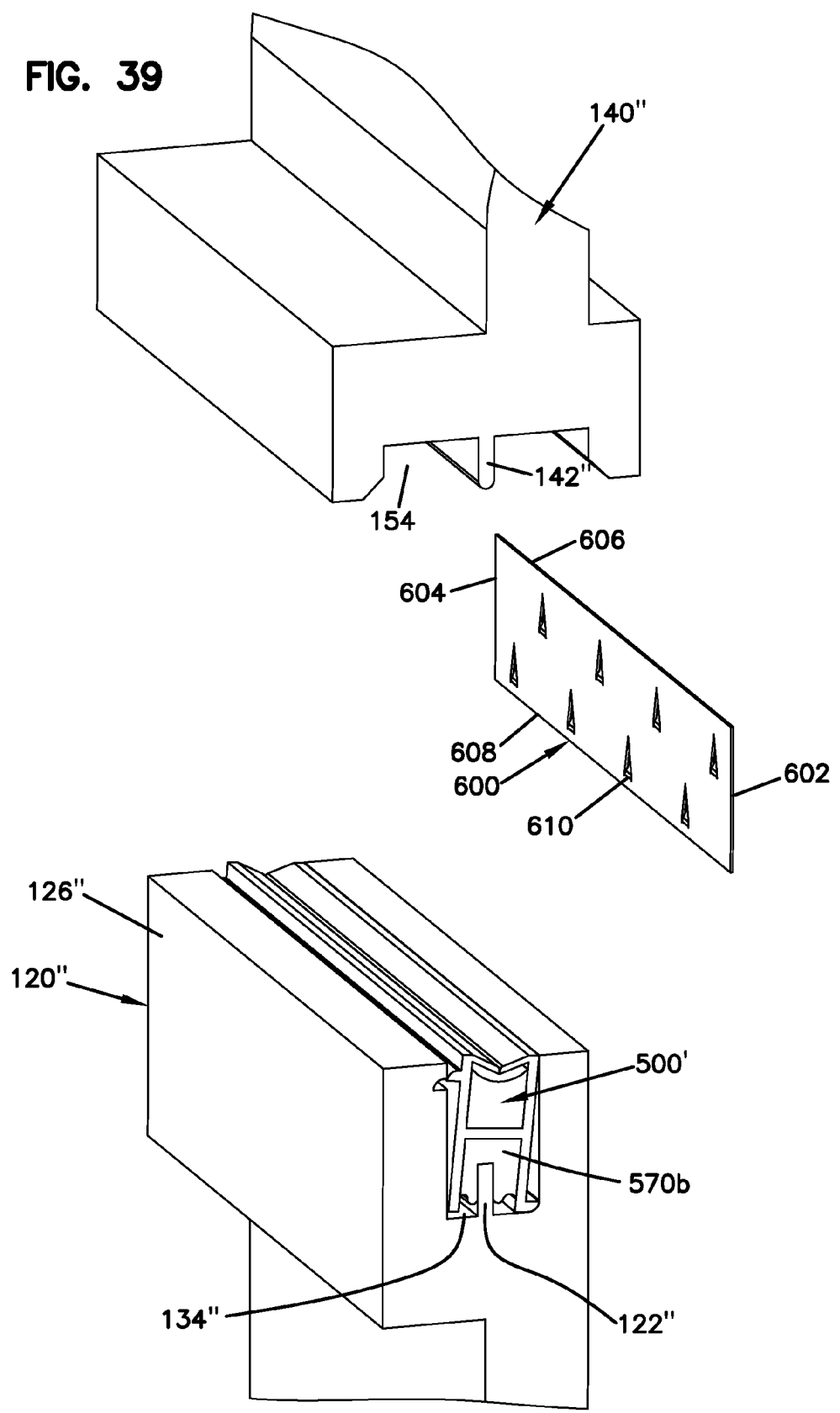
FIG. 39 is the partial exploded perspective view of FIG. 37 but with a sealing apparatus initially placed in a channel according to the principles of the present disclosure.
Figure 43:
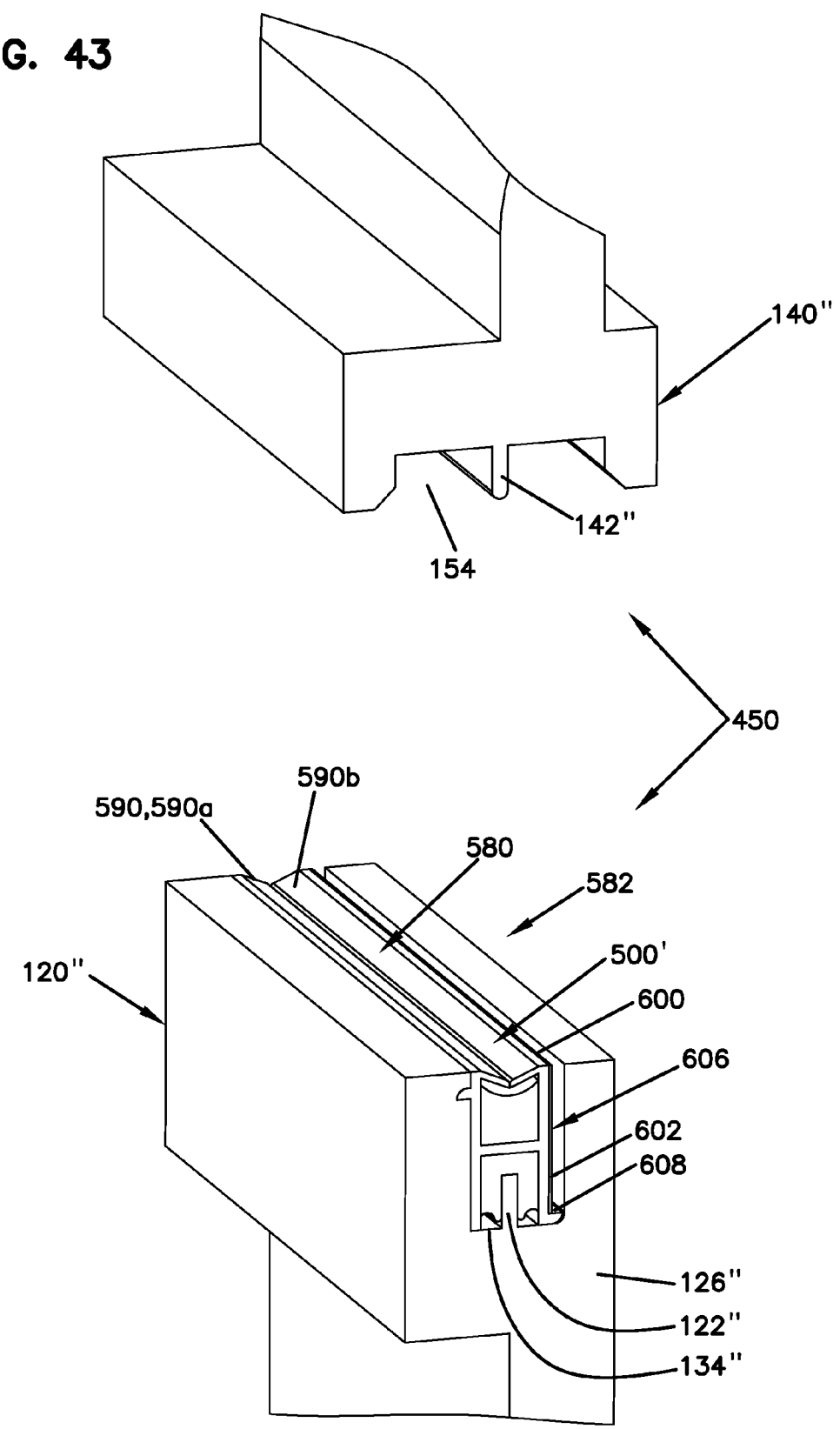
FIG. 43 is the partial exploded perspective view of FIG. 41 but with a retainer installed in the channel of FIG. 39.
Figure 45:
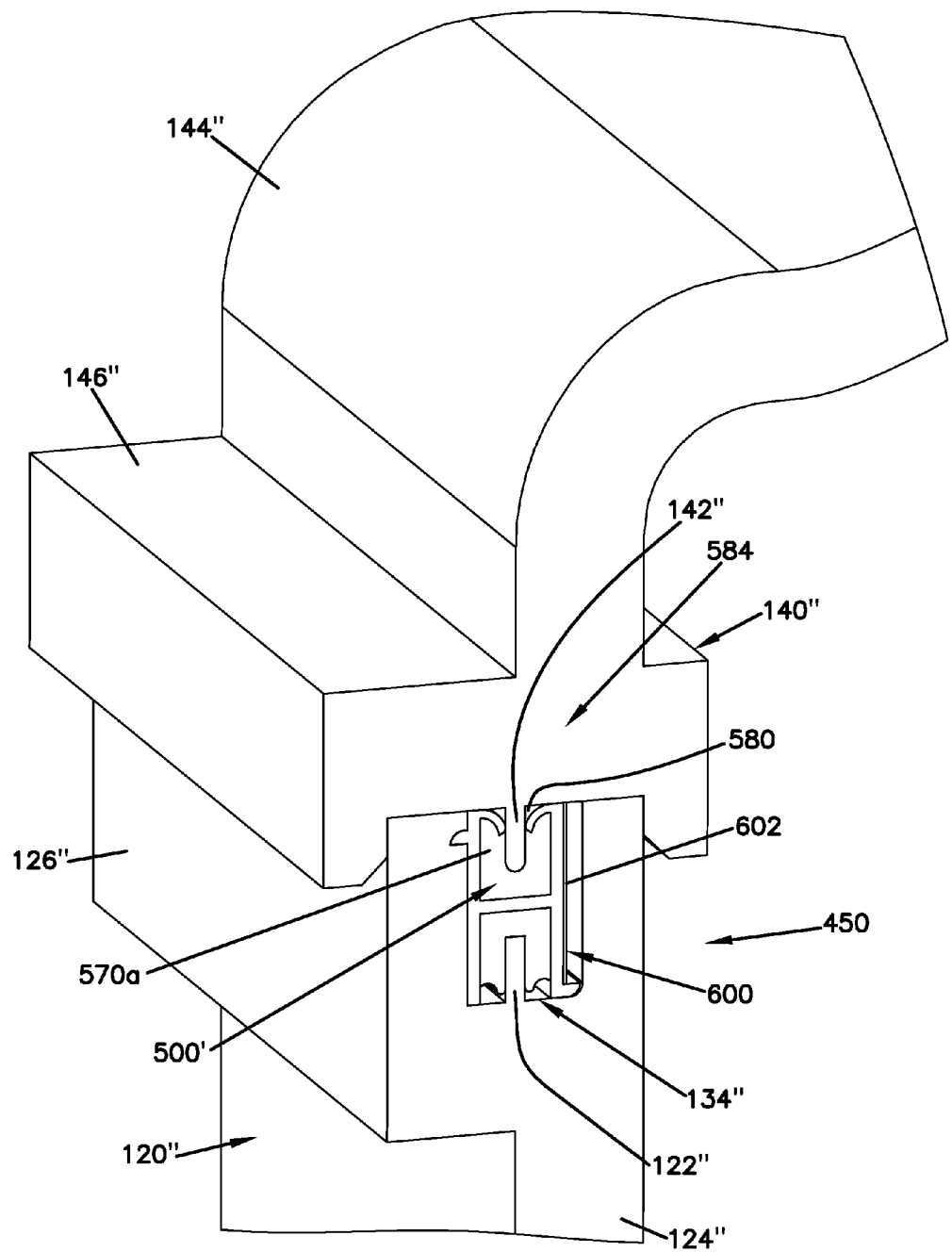
FIG. 45 is a partial perspective view of the enclosure interface of FIG. 37 with the sealing apparatus of FIG. 39 installed between a first housing piece and a second housing piece.

The sequence of figures between FIGS. 37 and 46 illustrate the sealing apparatuses 500' being installed into the channels 134" of the first housing piece 120". In particular, at FIG. 37 the sealing apparatuses 500' is positioned adjacent the channels 134". A second seal-access side 508' generally faces the first housing piece 120". As illustrated at FIGS. 38 and 40, the sealing apparatuses 500' is installed into the channels 134" by slightly tilting the sealing apparatuses 500'. The pivot surface 554 of the retaining tab 552 may mate against a pivot feature 152 of the channels 134". Upon the pivot surface 554 interfacing with the pivot feature 152, the sealant material 570, and in particular, the sealant material 570*b* may be penetrated by the sealing projection 122". As the sealant material 570 is compliant, the sealing projection 122" may initially be installed in the sealant material 570 at an initial position and be further moved into a final position within the sealant material 570 upon the sealing apparatus 500' being fully installed in the first housing piece 120" (see FIGS. 42 and 43).

As illustrated at FIGS. 40 and 42, the sealing apparatus 500' is tilted into position about the pivot feature 152. As this happens, the lead-in 534 engages a retaining notch 153 of the channels 134". A slight deformation of the carrier 510' may occur to facilitate the final installation of the sealing apparatuses 500' into the channels 134".

Upon the sealing apparatus 500 being installed into its final position within the first housing piece 120", the retainer 600 is installed to further retain the sealing apparatuses 500'. The retainer 600 is shown adjacent the first housing piece 120" at FIG. 42. The edge 608 is positioned facing the channels 134". As illustrated at FIG. 44, the retainer 600 is inserted into a gap between the carrier 510' and the channel 134". As depicted, the retainer 600 is inserted until the edge 608 abuts the retaining tab 552. The retaining member 610 may engage the first housing piece 120" and, in particular, the channel 134" and thereby resist being removed from the channel 134". The retainer 600 may further compress the sealing apparatuses 500' within the channel 134". As depicted at FIG. 44, the sealing apparatus 500' is generally flush with a mating surface of the first housing piece 120", when fully installed. Likewise, the edge 606 of the retainer 600 may be generally flush with the mating face of the first housing piece 120".

The second housing piece 140" may now be installed onto the first housing piece 120". Chamfers 162*a* and 162*b* may be included on the second housing piece 140" to facilitate aligning the second housing piece 140" with the first housing piece 120". As depicted, the chamfer 162*a* and the chamfer 162*b* are included on the sealing channel 154. The sealing channel 154 may capture the flange 126" of the first housing piece 120" when the second housing piece 140" is installed on the first housing piece 120", as illustrated at FIG. 46. The interface of the sealing channel 154 and the flange 126" may provide a lateral load capacity between the second housing piece 140" and the first housing piece 120".

In the preceding examples, the sealant material 570 was separated into the sealant material 570*a* and the sealant material 570*b*. In certain embodiments, the base wall 520 may be interrupted such that the sealant material 570*a* and the sealant material 570*b* may be in fluid communication with each other.

According to the principles of the present disclosure, the embodiment of the sealing apparatus 500" is illustrated at FIGS. 49-52. The sealing apparatus 500" is generally similar to the sealing apparatuses 500 except that the base wall 520 is fully or partially removed. Thus, the sealant material 570 may be within the single volume 570'. Like the sealing apparatus 500, the sealing apparatuses 500" extends between a first end 502" and a second end 504". The sealing apparatus 500 includes a first seal-access side 506" and a second seal-access side 508" that face in different directions. In the depicted embodiment, the seal-access side 506" and the seal-access side 508" face in opposite directions, but the sides could also face in different directions angled relative to one another. The sealant material 570' is similarly positioned within the carrier 510". The carrier 510" extends between a first end 512" and a second end 514". The carrier 510" may include a first body 516A and a second body 516B. The body 516A and the body 516B may be cross-connected and thereby form a body 516". The sealant material 570' may be positioned between the body 516A and the body 516B. The sealing apparatus 500" may generally be used in the applications of the sealing apparatus 500, 500' as illustrated and described above. The sealing apparatus 500" may be adapted to include some or all of the features of the sealing apparatus 500' described and illustrated above.

The above specification, examples, and data provide a complete description of the manufacture and use of the composition of certain inventive aspects of the present disclosure. It will be appreciated that the depicted and described embodiments are provided as examples of how the broad inventive aspects disclosed herein can be practiced, and that the broad inventive aspects can be incorporated into further embodiments other than those specifically shown and described.

What is claimed is:

1. An enclosure interface including a sealing apparatus, the enclosure interface comprising:

a first housing piece and a second housing piece that meet at an interface, at least one of the first and the second housing pieces defining an enclosure sealing channel that extends along the interface; and the sealing apparatus positioned at least partially within the enclosure sealing channel; the sealing apparatus comprising:

a carrier that is elongated along a carrier axis, the carrier including a first seal-access side and a second seal-access side, the first and the second seal-access sides facing in different directions, the carrier has a height extending from the first seal-access side in a direction toward the second seal-access side and a width perpendicular to the height, wherein the height is larger than the width; and sealant material carried by the carrier, the sealant material being accessible from the first seal-access side and the second seal-access side of the carrier, the sealant material being elongated along the carrier axis, and the entirety of the sealant material being recessed relative to the first and second seal-access sides of the carrier;

wherein when the first and the second housing pieces are mounted together so as to meet at the interface, the sealant material forms a first interface seal at the first seal-access side with the first housing piece and the sealant material also forms a second interface seal at the second seal-access side with the second housing piece.

2. The enclosure interface of claim 1, wherein the first housing piece includes a first integral sealing projection that embeds in the sealant material to form the first interface seal and the second housing piece includes a second integral sealing projection that embeds in the sealant material to form the second interface seal.

3. The enclosure interface of claim 1, wherein the sealant material is positioned between a first wall and a second wall that are defined by the carrier and that extend along the carrier axis.

4. The enclosure interface of claim 3, wherein the carrier includes a cross-structure that extends between the first and the second walls.

5. The enclosure interface of claim 4, wherein the cross-structure is a base wall, wherein the carrier defines a first carrier channel that is elongated along the carrier axis, that opens to the first seal-access side, and that includes a first closed end that is defined by the base wall, and wherein the carrier also defines a second carrier channel that is elongated along the carrier axis, that opens to the second seal-access side, and that includes a second closed end that is defined by the base wall.

6. The enclosure interface of claim 1, wherein the sealant material includes a first volume of sealant material that is accessible from the first seal-access side and that is elongated along the carrier axis and a second volume of sealant material that is accessible from the second seal-access side and that is also elongated along the carrier axis.

7. The enclosure interface of claim 6, wherein the first volume of sealant material is a different material from the second volume of sealant material.

8. The enclosure interface of claim 6, wherein at least one of the first volume of sealant material and the second volume of sealant material is a gel.

9. The enclosure interface of claim 6, wherein the first volume of sealant material and the second volume of sealant material are positioned between a first wall and a second wall that are defined by the carrier and wherein the first volume of sealant material and the second volume of sealant material are generally positioned on opposite sides of a cross-structure that extends between the first and the second walls.

10. The enclosure interface of claim 1, wherein the carrier further includes a cover structure that at least partially covers the first seal-access side.

11. The enclosure interface of claim 1, wherein the carrier further includes a cover structure that at least partially covers the first seal-access side and wherein the first housing piece includes an integral sealing projection that penetrates the cover structure and embeds in the sealant material to form the first interface seal.

12. A sealing apparatus comprising:

a carrier that is elongated along a carrier axis, the carrier defining a first carrier channel that is elongated along the carrier axis and that has a first seal-access side, the carrier also defining a second carrier channel that is elongated along the carrier axis and that has a second seal-access side, the first and the second seal-access sides facing in different directions, the carrier has a height extending from the first seal-access side in a direction toward the second seal-access side and a width perpendicular to the height, wherein the height is larger than the width;

a first volume of sealant material being entirely contained within the first carrier channel, the first volume of sealant material being accessible from the first seal-access side of the first carrier channel, the first volume of sealant material being elongated along the carrier axis; and a second volume of sealant material being entirely contained within the second carrier channel, the second volume of sealant material being accessible from the second seal-access side of the second carrier channel, and the second volume of sealant material being elongated along the carrier axis;

wherein the carrier includes a cover structure that at least partially covers the first seal-access side of the first carrier channel; and wherein the cover structure includes at least one resilient flap.

13. The sealing apparatus of claim 12, wherein the carrier is flexible.

14. The sealing apparatus of claim 12, wherein the first and the second seal-access sides face in opposite directions from one another.

15. The sealing apparatus of claim 12, wherein the carrier is an extruded polymeric part, and wherein the first and the second volumes of sealant material are respectively extruded within the first and the second carrier channels.

16. The sealing apparatus of claim 12, wherein the carrier has a transverse cross-sectional shape that is generally H-shaped.

17. The sealing apparatus of claim 12, wherein the cover structure includes first and second resilient flaps moveable from a closed position to an open position, each of the first and the second resilient flaps having a base end integral with a main body of the carrier, each of the first and the second resilient flaps having a free end, the free ends of the first and the second resilient flaps opposing one another when the cover structure is in a closed position, and the first and the second resilient flaps flexing away from one another and toward the first volume of sealant material about their base ends when the first and the second resilient flaps are moved from the closed position of the resilient flaps toward the open position of the resilient flaps.

18. The sealing apparatus of claim 12, wherein the first and the second carrier channels have transverse cross-sectional shapes, and wherein the first and the second volumes of sealant material respectively conform to the transverse cross-sectional shapes of the first and the second carrier channels.

19. The sealing apparatus of claim 18, wherein the transverse cross-sectional shapes of the carrier channels are generally rectangular.

20. The sealing apparatus of claim 12, wherein the first and the second volumes of sealant material each comprise a sealing gel including a block co-polymer and an extender.

21. The sealing apparatus of claim 20, wherein the sealing gels of the first and the second volumes of sealant material have identical chemical formulations.

22. The sealing apparatus of claim 20, wherein the sealing gels of the first and the second volumes of sealant material have different chemical formulations so as to each exhibit different physical properties.

23. The sealing apparatus of claim 12, wherein the first and the second volumes of sealant material each include a sealant material that is substantially volumetrically incompressible.

24. The sealing apparatus of claim 12, wherein the first volume of sealant material has a length that extends along the carrier axis, a width that is perpendicular relative to the length, and a height that is perpendicular relative to the width and the length, wherein the height extends between a closed side of the first carrier channel and the first seal-access side of the first carrier channel, and wherein a height to width ratio of the first volume of sealant material is greater than 2 to 1.

25. A sealing apparatus comprising:
a carrier that is elongated along a carrier axis, the carrier including a first seal-access side and a second seal-access side, the first and the second seal-access sides facing in different directions; and
sealant material carried by the carrier, the sealant material being accessible from the first seal-access side and the second seal-access side of the carrier, the sealant material being elongated along the carrier axis;
wherein the carrier further includes a cover structure that at least partially covers the first seal-access side, the cover structure including a pair of resilient flaps each having base ends attached to the carrier, the resilient flaps being adapted to prevent contaminates from entering the sealant material.

26. A sealing apparatus comprising:
a carrier that is elongated along a carrier axis, the carrier including a first seal-access side and a second seal-access side, the first and the second seal-access sides facing in different directions; and
sealant material carried by the carrier, the sealant material being accessible from the first seal-access side and the second seal-access side of the carrier, the sealant material being elongated along the carrier axis
an enclosure interface comprising:
a first housing piece and a second housing piece that meet at an interface, at least one of the first and the second housing pieces defining an enclosure sealing channel that extends along the interface; and
the sealing apparatus positioned at least partially within the enclosure sealing channel;
wherein when the first and the second housing pieces are mounted together so as to meet at the interface, the sealant material forms a first interface seal at the first seal-access side with the first housing piece and the sealant material also forms a second interface seal at the second seal-access side with the second housing piece; and
wherein the carrier further includes a cover structure that at least partially covers the first seal-access side and wherein the first housing piece includes an integral sealing projection that penetrates the cover structure and embeds in the sealant material to form the first interface seal.

27. A sealing apparatus comprising:
a carrier that is elongated along a carrier axis, the carrier defining a first carrier channel that is elongated along the carrier axis and that has a first seal-access side, the carrier also defining a second carrier channel that is elongated along the carrier axis and that has a second seal-access side, the first and the second seal-access sides facing in different directions;
a first volume of sealant material being entirely contained within the first carrier channel, the first volume of sealant material being accessible from the first seal-access side of the first carrier channel, the first volume of sealant material being elongated along the carrier axis; and
a second volume of sealant material being entirely contained within the second carrier channel, the second volume of sealant material being accessible from the second seal-access side of the second carrier channel, and the second volume of sealant material being elongated along the carrier axis;
wherein the carrier further includes a cover structure that at least partially covers the first seal-access side of the first carrier channel, the cover structure including a pair of resilient flaps each having base ends attached to the carrier, the resilient flaps being adapted to prevent contaminates from entering the first and second volume of sealant materials.

28. A sealing apparatus comprising:
a carrier that is elongated along a carrier axis, the carrier defining a first carrier channel that is elongated along the carrier axis and that has a first seal-access side, the carrier also defining a second carrier channel that is elongated along the carrier axis and that has a second seal-access side, the first and the second seal-access sides facing in different directions;
a first volume of sealant material being entirely contained within the first carrier channel, the first volume of sealant material being accessible from the first seal-access side of the first carrier channel, the first volume of sealant material being elongated along the carrier axis; and
a second volume of sealant material being entirely contained within the second carrier channel, the second volume of sealant material being accessible from the second seal-access side of the second carrier channel, and the second volume of sealant material being elongated along the carrier axis;
wherein the carrier further includes a cover structure that at least partially covers the first seal-access side of the first carrier channel, the cover structure including a pair of resilient flaps each having base ends attached to the carrier.

29. A sealing apparatus comprising:
a carrier that is elongated along a carrier axis, the carrier defining a first carrier channel that is elongated along the carrier axis and that has a first seal-access side, the carrier also defining a second carrier channel that is elongated along the carrier axis and that has a second seal-access side, the first and the second seal-access sides facing in different directions;
a first volume of sealant material contained within the first carrier channel, the first volume of sealant material being accessible from the first seal-access side of the first carrier channel, the first volume of sealant material being elongated along the carrier axis; and a second volume of sealant material contained within the second carrier channel, the second volume of sealant material being accessible from the second seal-access side of the second carrier channel, and the second volume of sealant material being elongated along the carrier axis;

wherein the carrier includes a cover structure that at least partially covers the first seal-access side of the first carrier channel;

wherein the cover structure includes at least one resilient flap; and wherein the cover structure includes first and second resilient flaps moveable from a closed position to an open position, each of the first and the second resilient flaps having a base end integral with a main body of the carrier, each of the first and the second resilient flaps having a free end, the free ends of the first and the second resilient flaps opposing one another when the cover structure is in a closed position, and the first and the second resilient flaps flexing away from one another and toward the first volume of sealant material about their base ends when the first and the second resilient flaps are moved from the closed position of the resilient flaps toward the open position of the resilient flaps.

30. A sealing apparatus comprising:

a carrier that is elongated along a carrier axis, the carrier defining a first carrier channel that is elongated along the carrier axis and that has a first seal-access side, the carrier also defining a second carrier channel that is elongated along the carrier axis and that has a second seal-access side, the first and the second seal-access sides facing in different directions, the carrier has a height that extends between the first and second seal-access sides and a width perpendicular to the height, wherein the height is larger than the width;

a first volume of sealant material contained within the first carrier channel, the first volume of sealant material being accessible from the first seal-access side of the first carrier channel, the first volume of sealant material being elongated along the carrier axis; and a second volume of sealant material contained within the second carrier channel, the second volume of sealant material being accessible from the second seal-access side of the second carrier channel, and the second volume of sealant material being elongated along the carrier axis;

wherein the carrier includes a cover structure that at least partially covers the first seal-access side of the first carrier channel, the cover structure including first and second resilient flaps moveable from a closed position to an open position, each of the first and the second resilient flaps having a base end integral with a main body of the carrier, each of the first and the second resilient flaps having a free end, the free ends of the first and the second resilient flaps opposing one another when the cover structure is in a closed position, and the first and the second resilient flaps flexing away from one another and toward the first volume of sealant material about their base ends when the first and the second resilient flaps are moved from the closed position of the resilient flaps toward the open position of the resilient flaps.

31. A sealing apparatus comprising:

a carrier that is elongated along a carrier axis, the carrier including a first seal-access side and a second seal-access side, the first and the second seal-access sides facing in different directions, the carrier has a height that extends between the first and second seal-access sides and a width perpendicular to the height, wherein the height is larger than the width; and sealant material carried by the carrier, the sealant material being accessible from the first seal-access side and the second seal-access side of the carrier, the sealant material being elongated along the carrier axis, and the sealant material being recessed relative to the first and second seal-access sides of the carrier;

an enclosure interface comprising:

a first housing piece and a second housing piece that meet at an interface, at least one of the first and the second housing pieces defining an enclosure sealing channel that extends along the interface; and the sealing apparatus positioned at least partially within the enclosure sealing channel;

wherein when the first and the second housing pieces are mounted together so as to meet at the interface, the sealant material forms a first interface seal at the first seal-access side with the first housing piece and the sealant material also forms a second interface seal at the second seal-access side with the second housing piece;

the carrier further including a cover structure that at least partially covers the first seal-access side and wherein the first housing piece includes an integral sealing projection that penetrates the cover structure and embeds in the sealant material to form the first interface seal.

32. An enclosure including a sealing apparatus, the enclosure comprising:

a housing including a first housing piece and a second housing piece, the first housing piece defining an opening having a perimeter, the first and the second housing pieces mounting together to cover the opening, the housing defining an enclosure channel that extends around the perimeter of the opening, the enclosure channel including at least one primary channel section interconnected by at least one junction section; the sealing apparatus comprising:

a carrier that is elongated along a carrier axis, the carrier including a first seal-access side and a second seal-access side, the first and the second seal-access sides facing in different directions, the carrier has a height extending from the first seal-access side in a direction toward the second seal-access side and a width perpendicular to the height, wherein the height is larger than the width; and sealant material carried by the carrier, the sealant material being accessible from the first seal-access side and the second seal-access side of the carrier, the sealant material being elongated along the carrier axis, and the entirety of the sealant material being recessed relative to the first and second seal-access sides of the carrier;

the sealing apparatus positioned at least partially within the enclosure channel for forming a seal between the first and the second housing pieces around the perimeter of the opening, the carrier of the sealing apparatus being positioned in the at least one primary channel section, the sealant material of the sealing apparatus being a first volume of sealant material; and at least one second volume of sealant material positioned within the at least one junction section of the enclosure channel, the second volume of sealant material being in communication with the first volume of sealant material, wherein when the first and the second housing pieces are mounted together the first and the second volumes of sealant material form a first seal with the first housing piece that extends continuously around the perimeter of the opening, and the first and the second volumes of sealant material form a second seal with the second housing piece that extends continuously around the perimeter of the opening.

33. The enclosure of claim 32, wherein the first housing piece includes a first integral sealing projection that embeds in the sealant material to form the first interface seal and the second housing piece includes a second integral sealing projection that embeds in the sealant material to form the second interface seal.

34. The enclosure of claim 32, wherein the carrier further includes a cover structure that at least partially covers the first seal-access side and wherein the first housing piece includes an integral sealing projection that penetrates the cover structure and embeds in the sealant material to form the first interface seal.

* * * * *